US010585128B2

(12) United States Patent
Ikami et al.

(10) Patent No.: US 10,585,128 B2
(45) Date of Patent: *Mar. 10, 2020

(54) NOISE SPECTRUM ANALYSIS FOR ELECTRONIC DEVICE

(71) Applicant: INTERNATIONAL BUSINESS MACHINES CORPORATION, Armonk, NY (US)

(72) Inventors: Shinichi Ikami, Yamato (JP); Lijie Qiao, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 562 days.

This patent is subject to a terminal disclaimer.

(21) Appl. No.: 15/334,390

(22) Filed: Oct. 26, 2016

(65) Prior Publication Data

US 2017/0363671 A1    Dec. 21, 2017

Related U.S. Application Data

(63) Continuation of application No. 15/187,842, filed on Jun. 21, 2016.

(51) Int. Cl.
*G01R 31/00* (2006.01)
*G06F 11/273* (2006.01)
*G01R 13/02* (2006.01)
*G06K 9/62* (2006.01)

(52) U.S. Cl.
CPC ......... *G01R 31/001* (2013.01); *G01R 31/002* (2013.01); *G01R 13/029* (2013.01); *G06F 11/273* (2013.01); *G06K 9/6276* (2013.01)

(58) Field of Classification Search
CPC ............................ G01R 31/001; G01R 31/002
See application file for complete search history.

(56) References Cited

U.S. PATENT DOCUMENTS

| | | |
|---|---|---|
| 7,672,792 B1 | 3/2010 | Cetto |
| 7,736,905 B2 | 6/2010 | Roder et al. |
| 8,412,520 B2 | 4/2013 | Furuta |

(Continued)

OTHER PUBLICATIONS

IBM: List of IBM Patents or Patent Applications Treated As Related (Appendix P), Nov. 1, 2016, 2 pages.

(Continued)

*Primary Examiner* — Michael J Dalbo
(74) *Attorney, Agent, or Firm* — Michael A. Petrocelli

(57) ABSTRACT

A method for analyzing noise spectrum of an electronic device includes storing a waveform data including a plurality of data points, the waveform data is obtained by measuring a target signal from the electronic device, removing data points corresponding to a background noise fluctuation based on a smooth curve of the waveform data, data points considered candidates for peaks are extracted from the waveform data, classifying the extracted data points based on a distance between adjacent data points in order to discriminate a cluster of distant data points from data points closely positioned to dominant peaks, determining the dominant peaks based on the cluster of distant data points such that the data points closely positioned to the dominant peaks are ignored, each dominant peak corresponds to the characteristic of the electronic device, and outputting the dominant peaks as an analysis result for the electronic device.

9 Claims, 17 Drawing Sheets

(56) References Cited

U.S. PATENT DOCUMENTS

| | | |
|---|---|---|
| 8,768,638 B2 | 7/2014 | Feldhaus |
| 8,994,657 B2 | 3/2015 | Liberty et al. |
| 2001/0011903 A1* | 8/2001 | O'Neill ............... G01R 31/3004 324/762.02 |
| 2002/0113901 A1* | 8/2002 | Osberger ............... H04N 5/145 348/699 |
| 2003/0145014 A1* | 7/2003 | Minch ..................... G06F 16/35 |
| 2006/0060768 A1 | 3/2006 | Kaufman et al. |
| 2006/0158173 A1 | 7/2006 | Takiguchi |
| 2006/0247707 A1 | 11/2006 | Meyer et al. |
| 2008/0157781 A1 | 7/2008 | Mason et al. |
| 2008/0319951 A1 | 12/2008 | Ueno et al. |
| 2010/0067710 A1 | 3/2010 | Hendriks |
| 2011/0125416 A1 | 5/2011 | Noda et al. |
| 2013/0277548 A1* | 10/2013 | Claude ............... H01J 49/0027 250/282 |
| 2015/0374240 A1* | 12/2015 | Lee ..................... A61B 5/0205 600/483 |
| 2016/0089047 A1 | 3/2016 | Jonnada et al. |
| 2016/0098561 A1* | 4/2016 | Keller .................. G06F 21/554 726/24 |
| 2016/0224830 A1 | 8/2016 | Noda et al. |
| 2016/0238576 A1 | 8/2016 | Kozawa |
| 2017/0363670 A1 | 12/2017 | Ikami |

OTHER PUBLICATIONS

"Findpeaks", Find local maxima—MATLAB findpeaks, http://jp.mathworks.com/help/signal/ref/findpeaks.html?lang=en, Accessed on May 19, 2016, 23 pages.

"LOESS / LOWESS algorithm", https://hulinks.co.jp/support/flexpro/v7/dataanalysis_LOESS.html, Last update Apr. 21, 2014, FlexPro 7 Japanese version support information, 3 pages.

Pending U.S. Appl. No. 15/187,842, filed Jun. 21, 2016, entitled: "Noise Spectrum Analysis for Electronic Device", 58 pages.

Ikami et al., "Noise Spectrum Analysis for Electronic Device", U.S. Appl. No. 16/508,995, filed Jul. 11, 2019.

List of IBM Patents or Patent Applications Treated as Related. Filed Jul. 11, 2019. 2 pages.

* cited by examiner

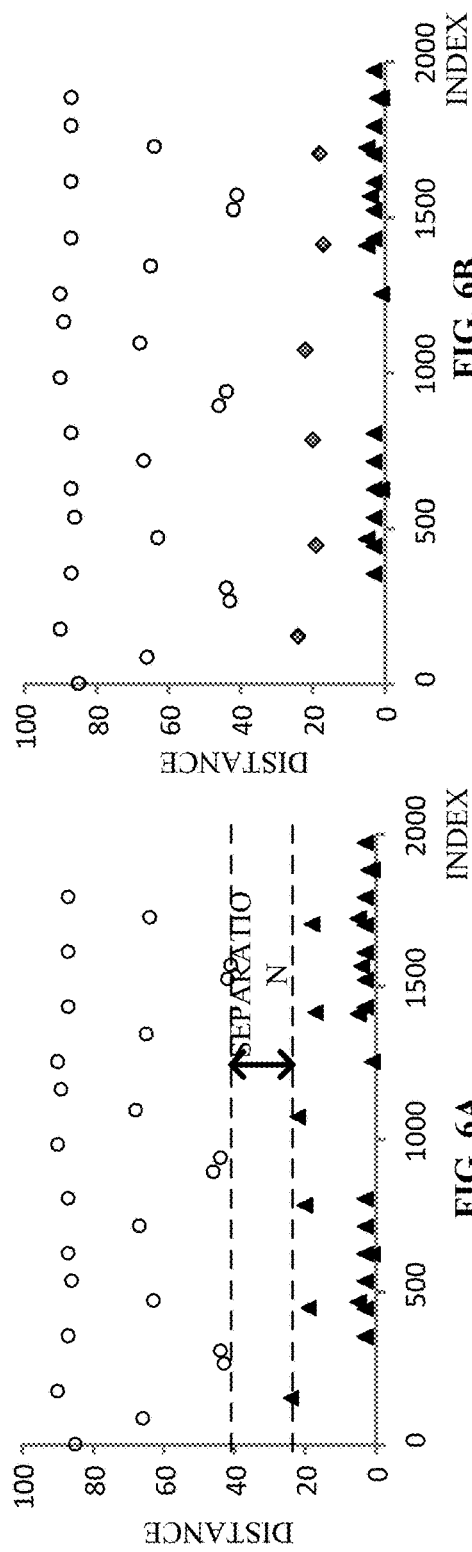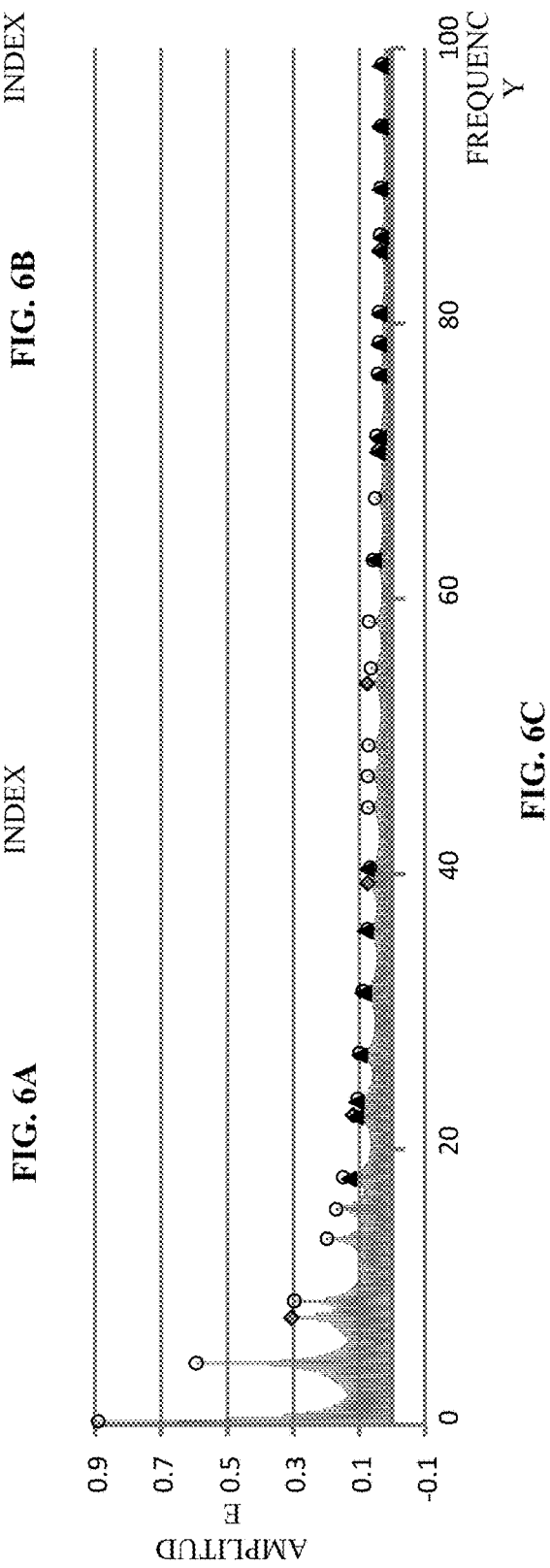

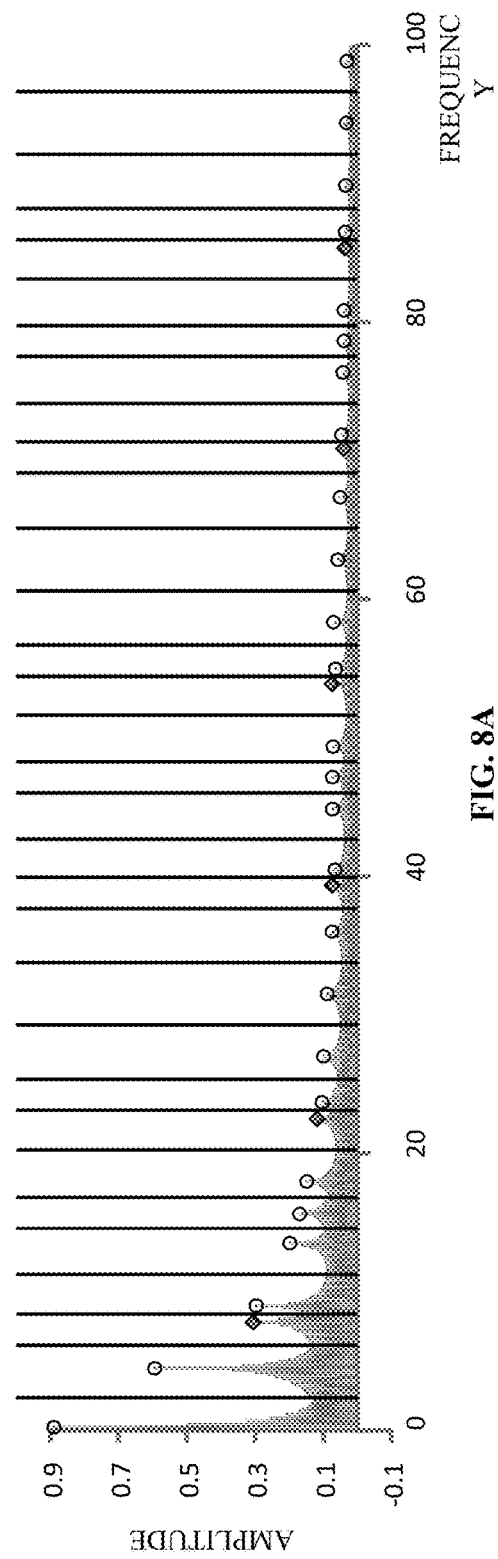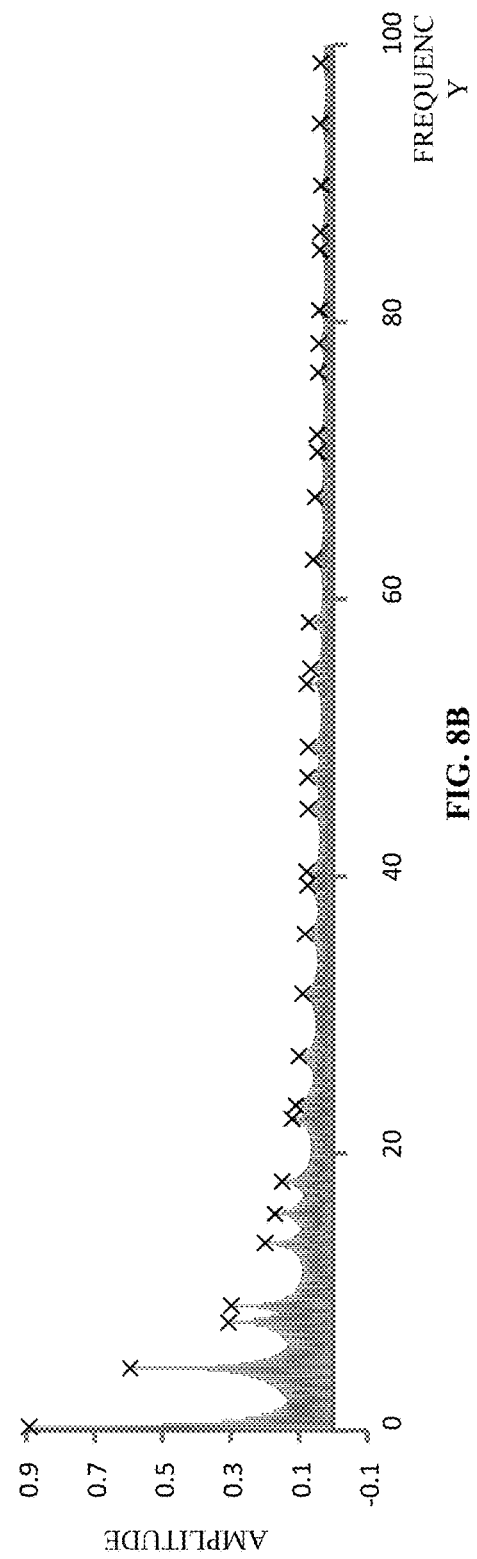

| ITERATION | SPAN | # OF REMAINING POINTS | REDUCTION AMOUNT | CHANGE |
|---|---|---|---|---|
| #1 | 0.01 | 2666 | 2334 | - |
| #2 | 0.03 | 1459 | 1207 | 1127 |
| #3 | 0.01 | 803 | 656 | 551 |
| #4 | 0.05 | 444 | 359 | 297 |
| #5 | 0.21 | 265 | 179 | 180 |
| #6 | 0.01 | 227 | 38 | 141 |
| #7 | 0.01 | 185 | 42 | -4 |

NOISE SPECTRUM ANALYSIS FOR ELECTRONIC DEVICE

BACKGROUND

The present invention, generally relates to device analysis, and more particularly to noise spectrum analysis for an electronic device.

Electromagnetic interference is an issue in electronic device engineering. Electronic devices are required to meet standards and regulations in relation to electromagnetic interference/compatibility (EMI/EMC) in many nations and market areas.

Semiconductor switching elements, which are basic building blocks to operate electronic devices, may cause electromagnetic noise with a frequency that is an integer multiple of the base frequency of their switching operations. During design and development of electronic devices, engineers typically conduct noise spectrum analysis and circuitry design based on technical considerations about noise characteristics of the electronic devices. Noise characteristics may be generally observed in a measured spectrum such that the electromagnetic noise emitted from the electronic device can be reduced. This may rely on engineers' individual technical skills and tacit technical knowledge.

Measured waveform data such as spectrum of a measured quantity (field strength, etc.) may include rapid fluctuations and several types of slow fluctuations overlapping each other with respect to a certain independent variable (frequency, etc.). Due to complexity of the waveform, finding meaningful peaks may require high level proficiency. In the noise reduction design, the peaks of noise spectrum are key characteristic and it is desired to characterize them properly. Since such low noise design may be achieved by a trial and error approach, the amount of data requiring the analysis and considerations may increase drastically.

The resolution of measurement tools such as, for example, a spectrum analyzer is increasing. With expanding memory size of the measurement system, the very detail of the noise spectrum is now available. In this situation, many noise peaks may be observed even for very higher harmonics of the base frequency. Also due to measurement automation, many data with many conditions can be collected from experiments such as electric noise measurements. Notwithstanding very detailed data with many conditions is now available, there is merely a handful of meaningful information with technical significance, such as dominant peaks.

SUMMARY

According to an embodiment of the present invention, a device analyzing system for analyzing noise spectrum of an electronic device includes: a memory; an output device; and a processing unit in communications with the memory and the output device. The device analyzing system is configured to set waveform data including a plurality of data points into the memory, in which the waveform data is obtained by measuring a target signal from the electronic device. The device analyzing system is configured to remove data points corresponding to background noise fluctuation based on a smooth curve of the waveform data to extract data points representing candidates for peaks from the waveform data stored in the memory. The device analyzing system is further configured to classify the extracted data points based on distance between adjacent data points to discriminate a cluster of distant data points from closely positioned data points. Each distant data point defines a region that shows a characteristic of the electronic device in the waveform data. The device analyzing system is further configured to determine one or more dominant peaks based on the cluster so as to ignore a data point appeared closely to the dominant peak and output the one or more dominant peaks by the output device as an analysis result for the electronic device. Each dominant peak represents the characteristic of the electronic device.

According to another embodiment of the present invention, a method performed by a device analyzing system for analyzing noise spectrum of an electronic device includes setting waveform data including a plurality of data points into a memory, in which the waveform data is obtained by measuring a target signal from the electronic device. The method also includes removing data points corresponding to background noise fluctuation based on a smooth curve of the waveform data to extract data points representing candidates for peaks from the waveform data stored in the memory. The method further includes classifying the extracted data points based on distance between adjacent data points to discriminate a cluster of distant data points from closely positioned data points, in which each distant data point defines a region that shows a characteristic of the electronic device in the waveform data. The method includes further determining one or more dominant peaks based on the cluster so as to ignore a data point appeared closely to the dominant peak and outputting the one or more dominant peaks by an output device as an analysis result for the electronic device. Each dominant peak represents the characteristic of the electronic device.

Computer program products relating to one or more aspects of the present invention are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

The following detailed description, given by way of example and not intended to limit the invention solely thereto, will best be appreciated in conjunction with the accompanying drawings, in which:

FIGS. 6A and 6B show distance of tentative peaks with label classified by the secondary peak classification process, according to an embodiment of the present invention;

FIG. 6C shows tentative peaks on the waveform data with the label classified by the secondary peak classification process, according to an embodiment of the present invention;

FIGS. 8A and 8B show boundaries and finally detected peaks by the tertiary peak determination process, according to an embodiment of the present invention;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Electromagnetic interference (EMI) is an issue for designing electronic devices. Semiconductor switching elements may cause electromagnetic noise. In noise reduction design, peaks of noise spectrum are key characteristics. Due to complexity of the observed noise spectrum waveforms, finding meaningful peaks may require professionals (e.g., engineers) to have a high level of expertise in the area and may also be affected by a difference in their levels of technical skills.

Traditional peak detection techniques merely detect local minute peaks and may often miss meaningful peaks in the spectrum.

Figure 1A:
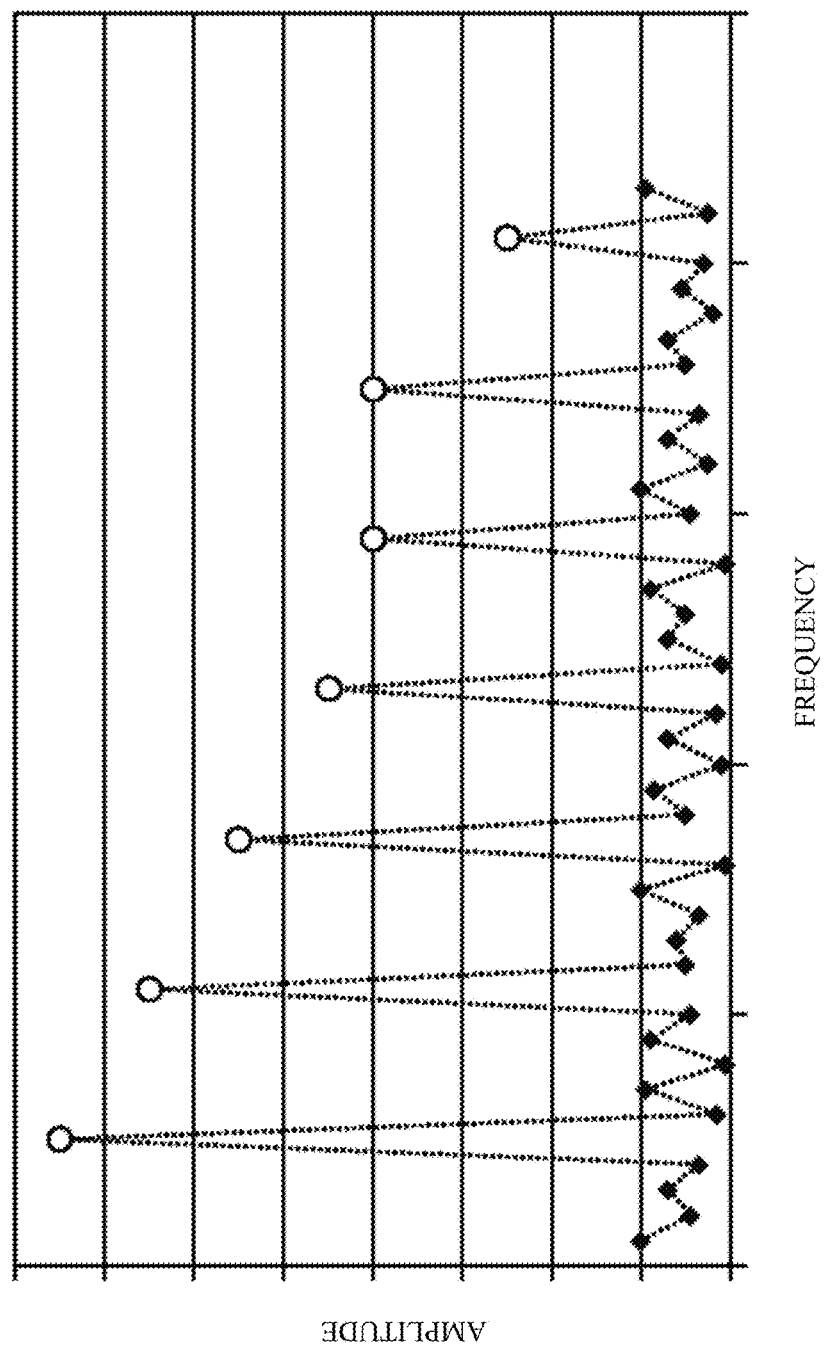
FIGS. 1A-1C depict examples of waveform data, which may be targets of a novel peak detection functionality, according to an embodiment of the present invention.
Figure 1B:
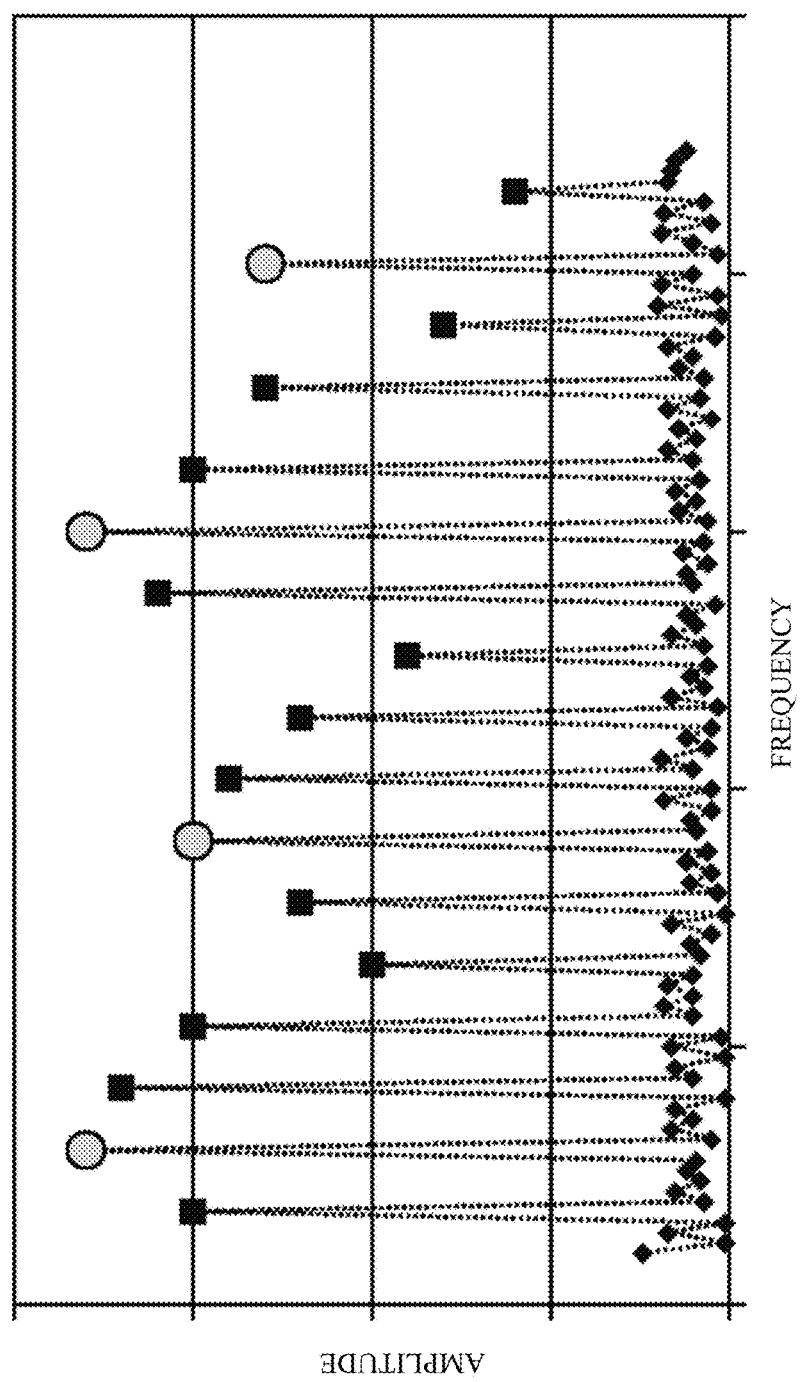
Figure 1C:
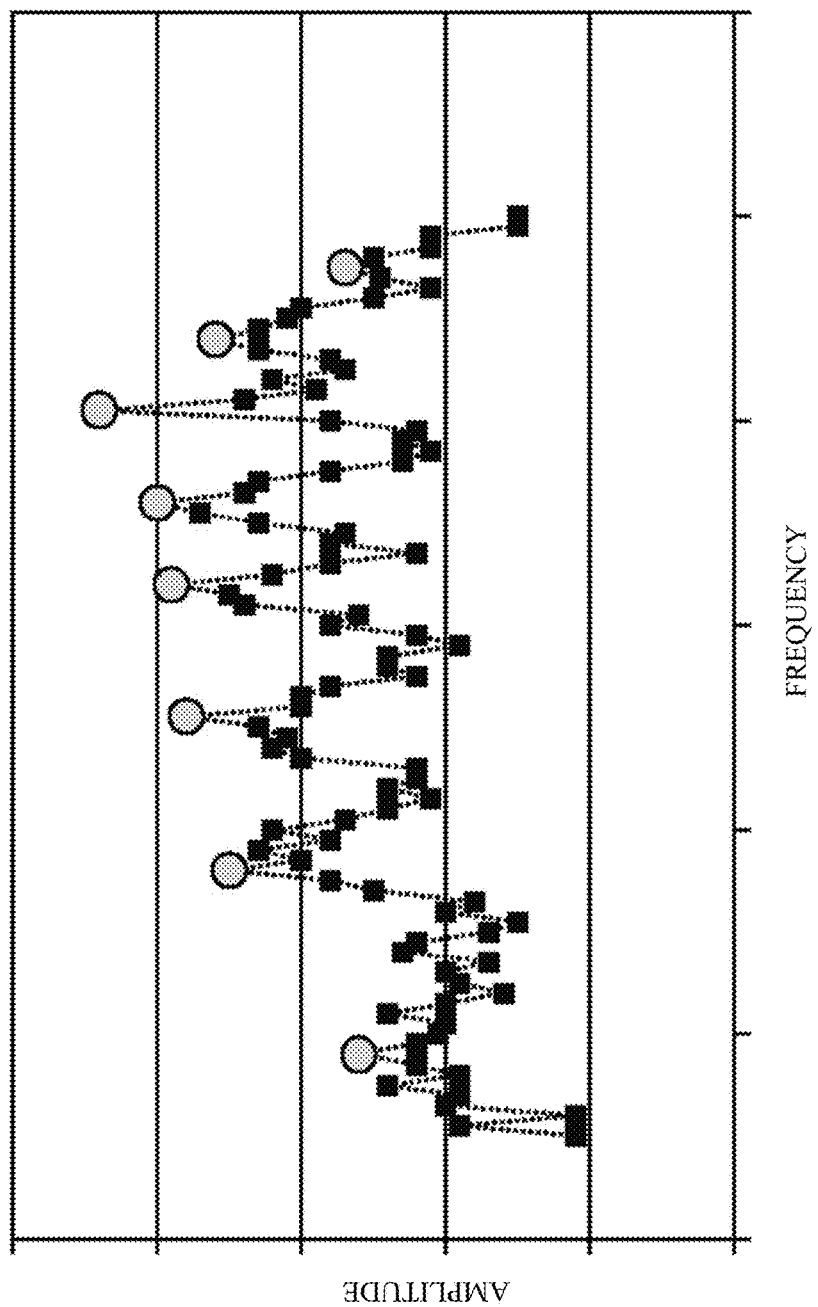

As described above, switching elements may cause harmonic noise with a frequency that is an integer multiple of the base frequency of their switching operation. When such noise is measured within certain ranges of an observation frequency at similar resolution, appearance of the observed waveform may change depending on a relationship between the base frequency and the observation frequency range as shown in FIGS. 1A-1C.

Electromagnetic noise may fall generally into two categories: narrowband noise and broadband noise. FIG. 1A shows an example of the narrowband noise, whereas FIGS. 1B and 1C show examples of the broadband noise.

The narrowband noise may be a low order harmonic noise with small integer multiple, which may be, for example, less than 10. The waveform shown in FIG. 1A may be observed in a case where the observation frequency is comparable to the base frequency of a noise source. Typically, low order harmonic noise shows definite peaks in spectrum data.

The broadband noise may be a high order harmonic noise with large integer multiple (e.g. 100-200), and may show a complex waveform that resembles a sinc function $(\sin(x)/x)$ as a whole.

The waveform shown in FIG. 1B may be observed in a case where the observation frequency is higher than the base frequency of the noise source. The waveform shown in FIG. 1C may be observed in a case where the observation frequency relative to the base frequency of the noise source is higher than that of FIG. 1B. Typically, the waveform shows an envelope outlining rapid fluctuations in the spectrum data. If such fluctuation rapidly grows due to resonance in the circuitry, it would cause a harmful effect on the electromagnetic interference/compatibility.

In these examples, definite peaks (white circles in FIG. 1A) and peaks of the envelopes representing slow fluctuation (gray circles in FIGS. 1B-1C) may be meaningful since such information is a clue for identifying the noise source. The amplitude of these peaks may be a subject to the regulation. On the other hand, low level background noise fluctuations (solid diamonds in FIGS. 1A-1B) should be ignored since such fluctuations may be associated to a thermal noise that has no relation to the test target. Also, rapid fluctuations that may form an envelope but not correspond to a peak of the envelope (solid squares in FIGS. 1B-1C), which may appear at a high frequency region in comparison with the base frequency of the noise source, may also be ignored.

Furthermore, the observed waveform may include several types of slow fluctuations due to the presence of a plurality of different noise sources. If there is a merely single noise source, neighboring peaks would be observed with a frequency interval equal to the base frequency of the single noise source at a minimum. Thus, there may be a sufficient interval between neighboring peaks in the case where the observation frequency is comparable to the base frequency. Even in the case where the observation frequency is considerably higher than the base frequency, there may be a sufficient interval between neighboring peaks of the envelopes.

On the other hand, if there are multiple noise sources the peaks from different noise sources can have any arbitrary frequency difference. Therefore, relatively short interval between the neighboring peaks may be observed in both cases.

As the density of semiconductors devices increases and their functionality is improved, advanced electronic devices may include many electronic elements adjacently arranged one another, which may have same, similar, or slightly different operating frequencies and may become a potential noise source in an electronic circuitry. Accordingly, noise from each discrete noise source may be spatially coupled so as to form complex waveforms. In noise reduction design, it may be desired to have overall noise waveforms decomposed to each component from each discrete noise source. For this purpose, detail noise analysis about the frequency and the magnitude of the noise peaks may be requested.

As described above, since noise sources may be independent from each other, a plurality of high order harmonics from multiple discrete noise sources may appear in the adjacent or overlapping frequency region. Thereby, distinction of the noise source among various electronic elements may become difficult. Typically, engineers tackle the noise issue by analyzing each dominant noise source that has a significant magnitude. As such, there is a need in present noise spectrum analysis to focus on detecting dominant peaks in waveform data.

Embodiments of the present invention may provide a method, associated device analyzing system, and computer program product for objectively detecting dominant peaks from waveform data obtained by measuring a target signal from an electronic device in which the waveform may fluctuate with respect to an independent variable due to a certain reason and show one or more peaks with certain technical significance as a part of whole peaks. It should be noted that the proposed method, associated device analyzing system, and computer program product are independent from individual technical skills.

Therefore embodiments of the present invention may, among other potential benefits, provide a novel peak detection process in which a device analyzing system detects dominant peaks from waveform data that is obtained by measuring a target signal from an electronic device. The examples of waveform data shown in FIGS. 1A-1C may be target of the novel peak detection functionality that will be described in detail below according to one or more embodiments of the present invention.

Figure 2:
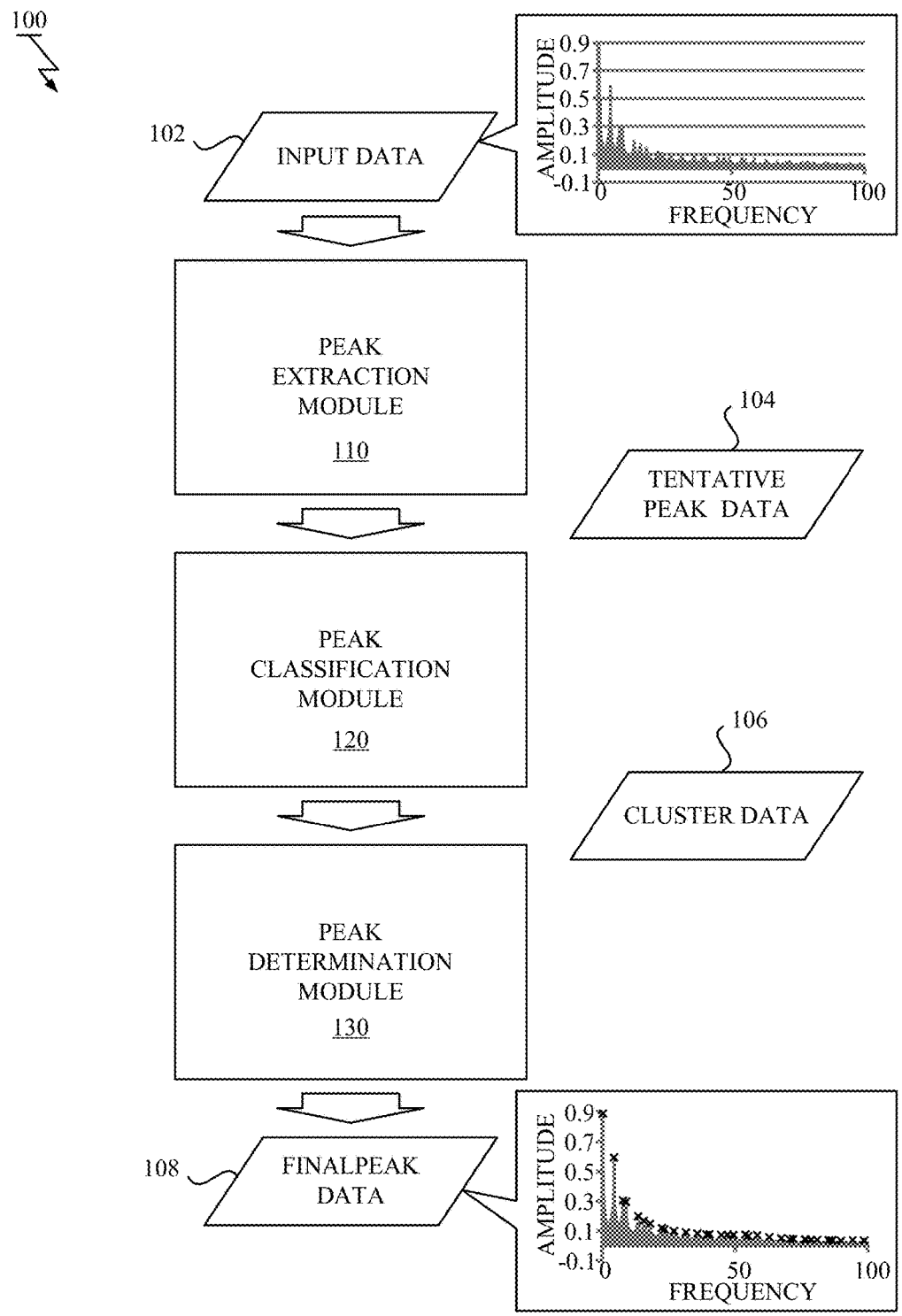
FIG. 2 is a block diagram illustrating processing and data flow in a device analyzing system that includes a novel peak detection functionality, according to an embodiment of the present invention.

Referring now to FIG. 2, a block diagram illustrating processing and data flow in a device analyzing system 100 that implements a novel peak detection functionality is shown, according to an embodiment of the present invention. As shown in FIG. 2, the device analyzing system 100 may include a measurement tool 104, a computing device 106 and an output device 108.

The measurement tool 104 may be equipped with a probing device 102, which is place at the vicinity of a device under test (DUT) 200, the DUT 200 may include a target electronic device (not shown). The measurement tool 104 may measure a target signal emitted from the DUT 200 through the probing device 102 to acquire input data 152. An example of the measurement tool 104 may include, but is not limited to, a spectrum analyzer, an oscilloscope, etc.

The computing device 106 may receive the input data 152 from the measurement tool 104 and store the input data 152 in a memory (not shown) of the computing device 106. The computing device 106 may include a peak extraction module 110 that extracts tentative peaks from the input data 152, a peak classification module 120 that receives tentative peak data 154 including extracted tentative peaks and classifies the tentative peaks, and a peak determination module 130 that receives cluster data 156 including classified tentative peaks and determines dominant peaks.

The input data 152 may be a waveform data representing fluctuations of a measured quantity. The input data 152 may have a plurality of data points, each of which includes an independent variable and a dependent variable representing the measured quantity. The independent variable may be frequency, time, etc. If the waveform data includes spectrum data, the independent variable may be, for example, frequency. If the waveform data includes time series data, the independent variable may be, for example, time.

In one or more embodiments, the waveform data may be an electromagnetic interference signal with respect to a specific independent variable. Such waveform data may include rapid fluctuations and several types of slow fluctuations with respect to the independent variable.

The input data 152 may include spectrum data representing fluctuation of noise signal with respect to frequency in a linear scale. The measured quantity may include field strength of electromagnetic interference (EMI) emission. It should be noted that field strength spectrum data is employed as an example of the target waveform data used for analysis. The target waveform data may be any type of waveform data that represents fluctuations of certain measured quantity in linear or logarithmic scales.

The peak extraction module 110 is configured to extract data points representing candidates for peaks (tentative peaks) from the input data 152. In this embodiment, the peak extraction module 110 first sets the input data 152 into a temporal data structure (e.g. data frame, array, etc.) and then repeatedly removes data points that may corresponds to background noise fluctuations from the temporal data structure by using a smoothing technique.

In each iteration of the removal process (hereinafter "removal"), the peak extraction module 110 calculates a smooth curve of the input data 152 in order to obtain a fit to data points in the temporal data structure. It should be noted that the smooth curve may be calculated based on all the data points from the input data 152 at a first removal, and the remaining data points from a previous removal at a second or later removal. Then, the peak extraction module 110 selects data points to be removed from the temporal data structure based on an amplitude of each remaining data point relative to the calculated smooth curve.

The background noise fluctuation may include thermal noise (solid diamonds in FIGS. 1A-1B) and rapid fluctuations that form an envelope but does not correspond to a peak of the envelope (solid squares in FIGS. 1B-1C). The data points representing the tentative peaks are extracted from the input data 152 as remaining data points in the temporal data structure after final removal. The input data 152 and the tentative peak data 154 including the extracted data points may be passed to the peak classification module 120 for further processing.

The peak classification module 120 is configured to classify the extracted data points in the tentative peak data 154 by performing clustering analysis based on distance. In one or more embodiments, the distance may be defined as an interval between the adjacent data points in the tentative peak data 154 with respect to the independent variable. The peak classification module 120 discriminates a cluster of distant data points from closely positioned data points. Each distant data point in the cluster may define a region that may show a characteristic of the DUT 200 in the waveform data. The input data 152 and the cluster data 156 that includes at least one cluster of the distant data points may be passed to the peak determination module 130 for further processing.

The peak determination module 130 is configured to determine one or more dominant peaks in the input data 152 based on the cluster data 156. In the present embodiment, the peak determination module 130 sets boundaries on the input data 152 between the distant data points in the cluster and detects an extreme from the input data 152 within each region defined by the adjacent boundaries. The peak determination module 130 may detect an extreme having highest amplitude within the region as the dominant peak. Data points close to the dominant peak, which may represent neighboring extra peak around the dominant peak, may be ignored by the determination. The dominant peak may represent the characteristic of the DUT 200.

The final peak data 158 includes the one or more resultant peaks, each of which may be defined by a data point including value of the independent variable (e.g. frequency) and value of the dependent variable (e.g. amplitude of the field strength).

In the present embodiment, the extreme having highest amplitude within the region is detected as the dominant peak. However, there are no limitations on what kind of peak should be detected. In other embodiments, a plurality of extremes or second (or later) largest extreme may be detected by the peak determination module 130 within each region as the dominant peak. In another embodiment, extremes with a frequency that is an integer multiple of certain base frequency may be detected as the dominant peak prior to other extremes. In yet another embodiment, the peak determination module 130 may determine the obtained distant data points in the cluster as the dominant peaks and ignore the closely positioned data points having small distance.

The computing device 106 may be further configured to output the final peak data 158 including the one or more dominant peaks via the output device 108 as a noise analysis result for the DUT 200. The output device 108 may be, but is not limited to, a display device, a printing device, a storage device, or an interface device connected to other external device such as a product inspection system.

In the present embodiment, the final peak data 158 may include the definite peaks (white circles in FIG. 1A) and the peaks of the envelopes (gray circles in FIGS. 1B-1C), which may be considered as meaningful.

In some embodiments, each of the modules 110, 120 and 130 in the device analyzing system 100 described in FIG. 2 may be implemented, for example, as a software module including program instructions and/or data structures in conjunction with hardware components such as a processor, a memory, etc. in the computing device 106; as a hardware module including electronic circuitry; or as a combination thereof. The modules 110, 120 and 130 described in FIG. 2 may be implemented on a single computer device such as a personal computer and a server machine or over a plurality of devices such as a computer cluster of computer devices connected in a distributed manner. In other embodiment, the modules 110, 120 and 130 described in FIG. 2 may be implemented on a single apparatus such as a spectrum analyzer, an oscilloscope, or may be built into a test measurement system.

Figure 3:
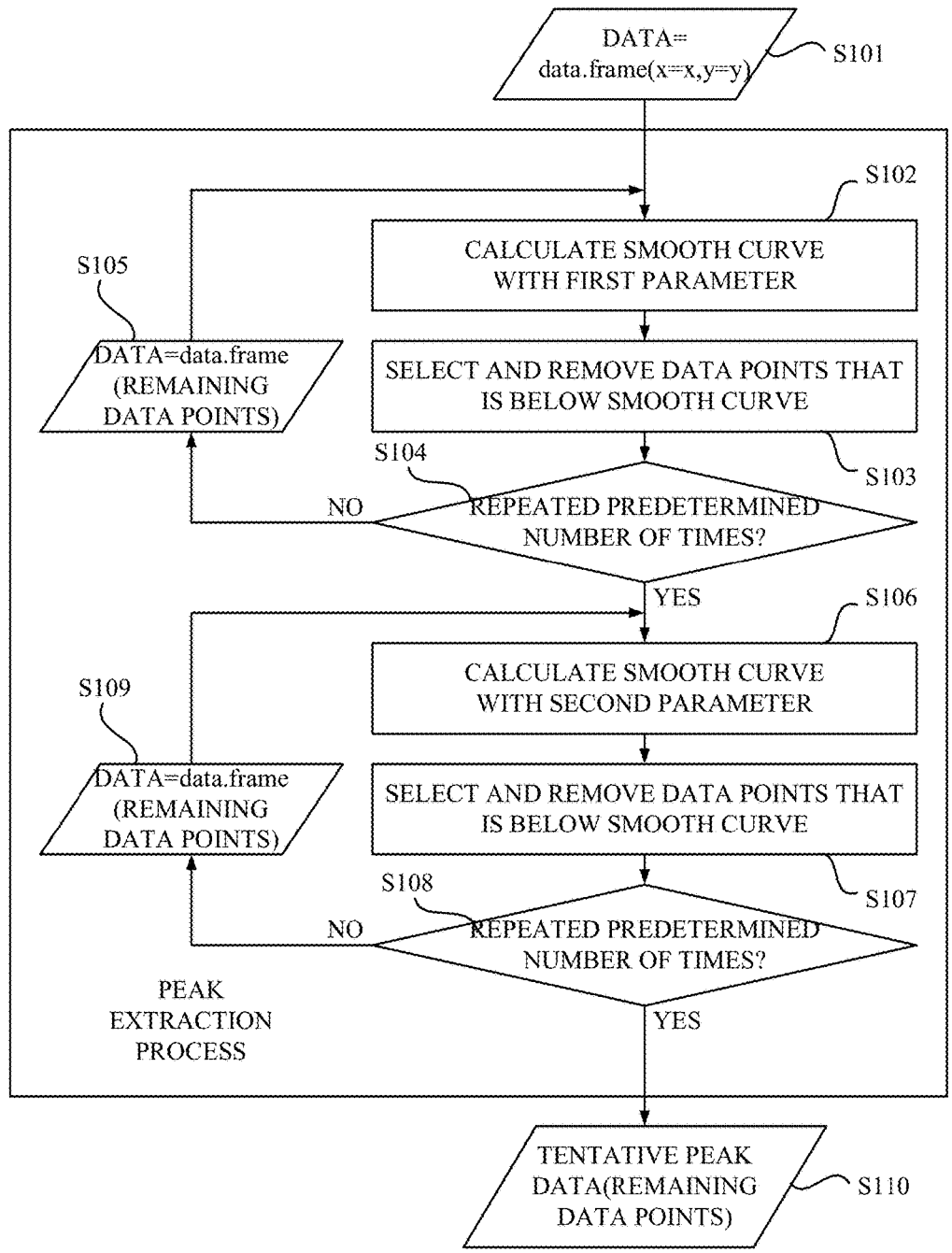
FIG. 3 is a flowchart depicting a primary peak extraction process in a novel peak detection process, according to an embodiment of the present invention.

Referring now to FIG. 3, a flowchart depicting a primary peak extraction process in the novel peak detection process of FIG. 2 is shown, according to an embodiment of the present invention. Note that the peak extraction process shown in FIG. 3 may be performed by a processing unit that implements the peak extraction module 110 shown in FIG. 2.

The process shown in FIG. 3 begins in response to receiving a request for peak detection with designated input data 152 (FIG. 2) stored, for instance, in a storage device. At step S101, the peak extraction module 110 (FIG. 2) reads the designated input data 152 (FIG. 2) from the storage device and sets the input data 152 (FIG. 2) into the temporal data structure created on a memory operably coupled to the processing unit. In this embodiment, the input data 152 (FIG. 2) is fed into a data frame which is a data structure having coupled collections of variables.

At step S102, the peak extraction module 110 (FIG. 2) calculates a smooth curve with a first parameter. The smooth curve can be calculated by any known smoothing technique. Such smoothing techniques may include, for example, a locally weighted scatterplot smoothing technique, also referred to as a LOESS smoothing.

The LOESS smoothing utilizes a weighting function which causes outlier data points to have less influence on adjacent smoothed values in comparison to other data points. Since accuracy of curve fitting is expected to be improved by executing the LOESS smoothing a multiple times, the LOESS smoothing may be preferably employed as the smoothing technique for the peak extraction process.

The smoothing technique may generally include a parameter. In embodiments in which the smoothing technique is a LOESS smoothing, the parameter may be a smoothing parameter called "span" which determines how much of the input data (e.g., data points) is used to fit each local polynomial to a desired curve smoothness. The span may be defined as a ratio of the number of points to be used in a moving regression to the number of points in the input data (e.g., input data 152 in FIG. 2). When the span increases, the curve becomes smoother. In some embodiments, the first parameter may be, for instance, a default value provided by a certain expert or designated by the user as an argument of the request. It should be noted that, although embodiments are described using the LOESS smoothing, other smoothing techniques may also be applied with corresponding smoothing parameter(s).

At step S103, the peak extraction module 110 (FIG. 2) selects data points to be removed from the temporal data structure based on whether the amplitude of each data points in the temporal data structure is below the calculated smooth curve or not, and removes the selected data points that are below the smooth curve.

At step S104, the peak extraction module 110 (FIG. 2) determines whether the number of iterations of the removal with the first parameter has reached a predetermined number of times or not. The predetermined number of times may be, for example, a default value provided by an expert (e.g., a person skilled in the art) or designated by the user as an argument of the request. If the peak extraction module 110 (FIG. 2) determines that the number of iterations has not reached the predetermined number of times in step S104 (NO), the process branches to step S105. At step S105, the peak extraction module 110 (FIG. 2) sets the remaining data point as input for further removal process and loops back to step S102. If the peak extraction module 110 (FIG. 2) determines that the number of the iterations has reached the predetermined number of times in step S104 (YES), the process proceeds to step S106.

At step S106, the peak extraction module 110 (FIG. 2) calculates another smooth curve with a second parameter. The second parameter may be different from the first parameter used in the step S102. In a preferred embodiment using the LOESS smoothing, the second parameter may be specified so that the calculated smooth curve becomes less smooth than that of the first parameter. The second parameter may be, for example, a default value provided by a certain expert or designated by the user as an argument of the request. At step S107, the peak extraction module 110 (FIG. 2) selects data points to be removed from the remaining data points based on whether the amplitude of each remaining data points is below the currently calculated smooth curve or not, and removes the selected data points.

At step S108, the peak extraction module 110 (FIG. 2) determines whether the number of iterations of the removal with the second parameter has reached a predetermined number of times or not. The predetermined number at step S108 may be the same or different to that of step S104. As described above, the predetermined number of times may be, for example, a default value provided by an expert or designated by the user as an argument of the request. If the peak extraction module 110 (FIG. 2) determines that the number of the iterations has not reached the predetermined number of times in step S108 (NO), the process branches to step S109. At step S109, the peak extraction module 110 (FIG. 2) sets the remaining data points as input for further removal process and loops back to step S106. If the peak extraction module 110 (FIG. 2) determines that the number of iterations has reached the predetermined number of times in step S108 (YES), the process branches to step S110.

At step S110, the peak extraction module 110 (FIG. 2) outputs the tentative peak data 154 (FIG. 2) including currently remaining data points in the temporal data structure and ends the process.

As shown in FIG. 3, the process of removing data points may be repeated with each parameter until the number of iterations has reached the predetermined number of times. The data points representing the candidates for peaks may be extracted as the remaining data points in the temporal data structure after the final removal.

Referring now to FIGS. 4A-4D, remaining data points with waveform at each stage of the primary peak extraction process are shown, according to an embodiment of the present invention. In FIGS. 4A-4D, gray lines represent original waveform of the input data 152 (FIG. 2) and the solid black curve represents the smooth curve calculated at each stage of the primary peak extraction process described above. The white circles represent data points, each of which is above the calculated smooth curve.

Figure 4A:
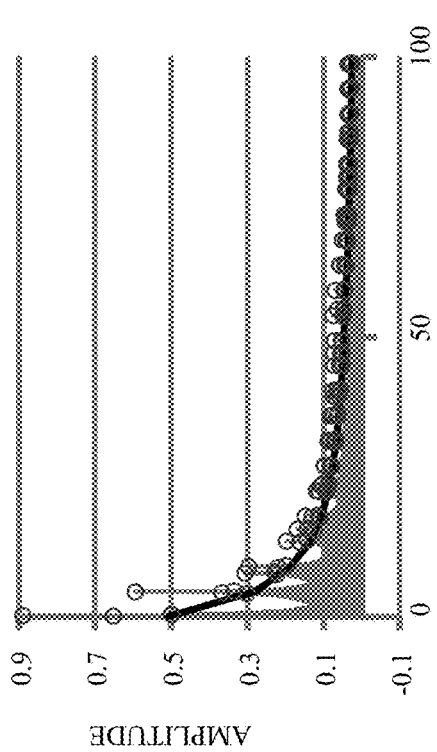
FIGS. 4A-4D describes remaining data points with the waveform at each stage of the primary peak extraction process, according to an embodiment of the present invention.
Figure 4B:
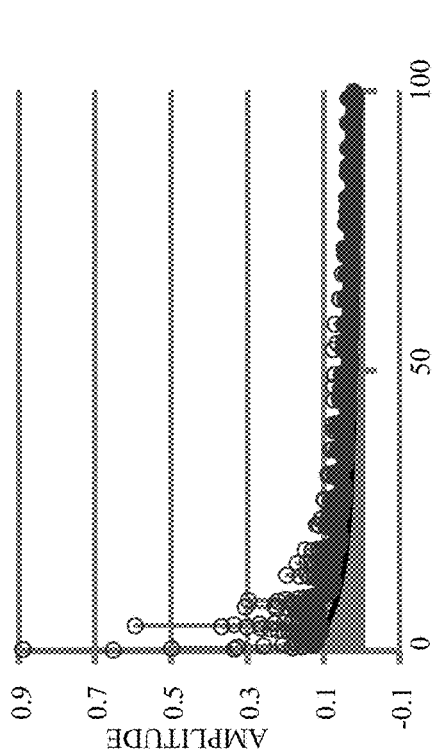
Figure 4C:
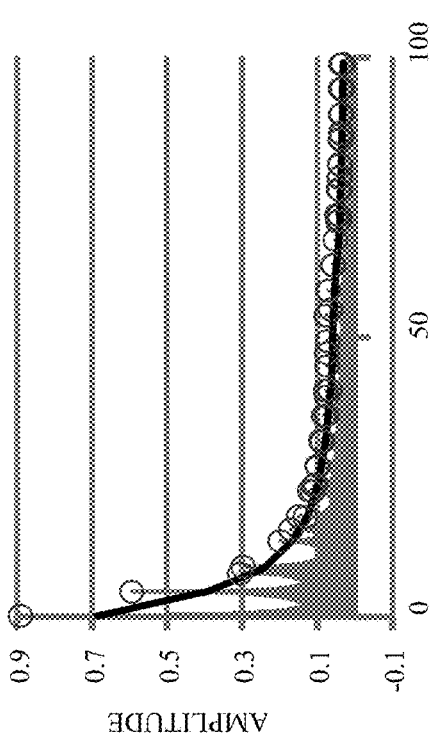

As shown in FIGS. 4A-4C, the smooth curves after each data point removal become progressively smoother. Data points located at a lower side of the smooth curve are removed while maintaining the trend of the original waveform as much as possible. The lower side of the curve is repeatedly grinded, whereas data points at the upper side of the curve remain.

Figure 4D:
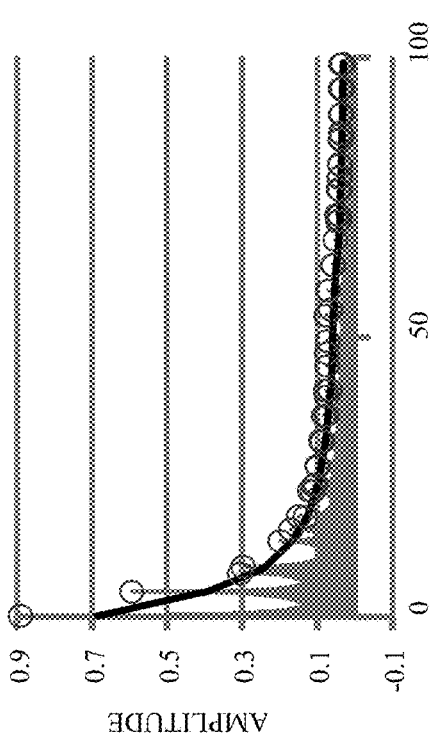

In the example shown in FIGS. 4A-4C, a total of four removal processes are conducted to improve accuracy of the curve fitting and the peak extraction, the first and second removal processes were performed using the first parameter while the third and fourth removal processes were performed using the second parameter. As shown in FIG. 4D, the remaining data points after the final removal process seem to be peaks in the input waveform. Thus, the final remaining data points may be considered as candidates for peaks.

Figure 5:
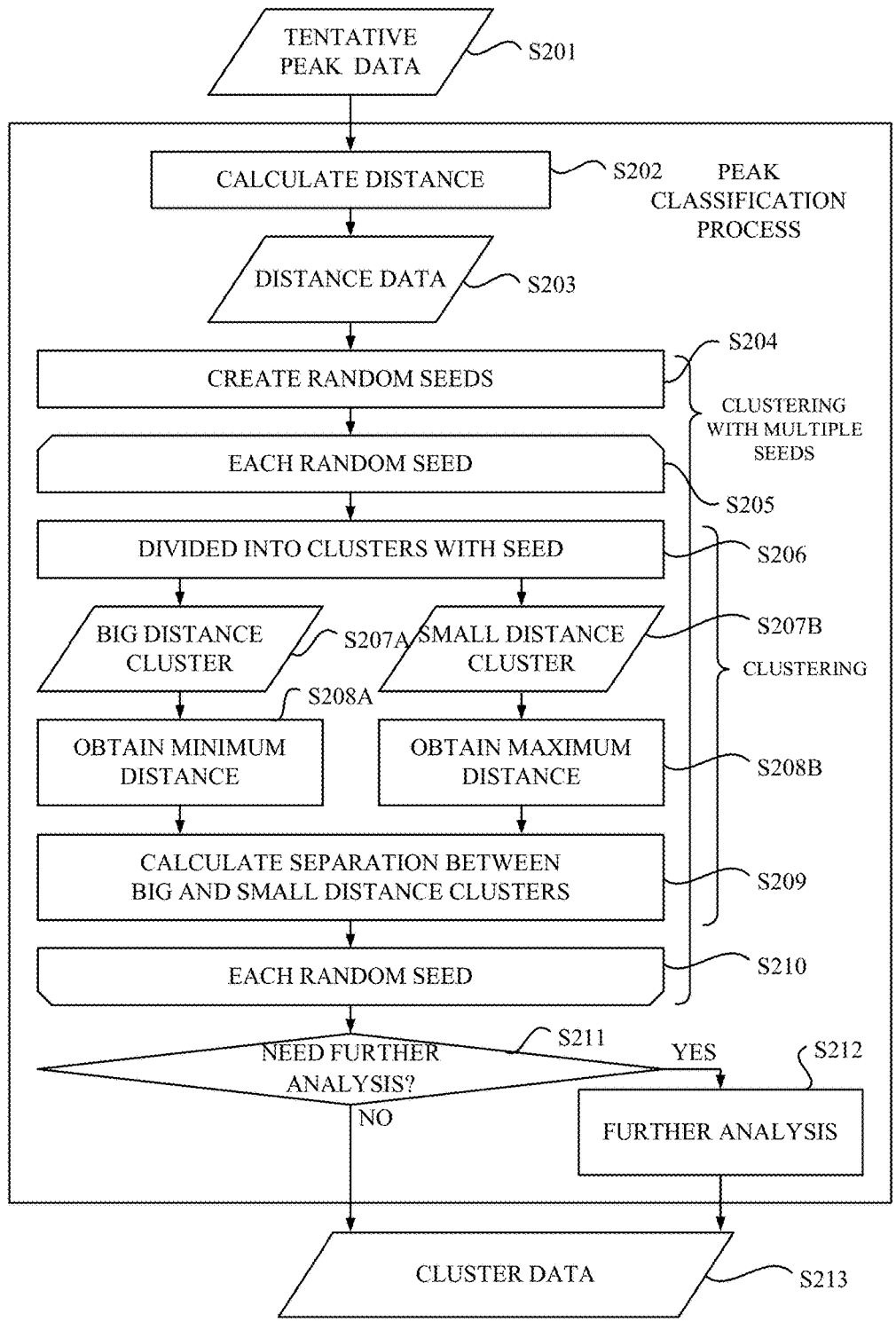
FIG. 5 is a flowchart depicting a secondary peak classification process in the novel peak detection process, according to an embodiment of the present invention.

Referring now to FIG. 5, a flowchart depicting a secondary peak classification process in the novel peak detection process of FIG. 2 is shown, according to an embodiment of the present invention. Note that the peak classification process shown in FIG. 5 may be performed by a processing unit that implements the peak classification module 120 shown in FIG. 2.

The process shown in FIG. 5 may begin after the process shown in FIG. 3 is finished. At step S201, the peak classification module 120 (FIG. 2) receives the tentative peak data 154 (FIG. 2) from the peak extraction module 110 (FIG. 2). At step S202, the peak classification module 120 (FIG. 2) calculates a distance between adjacent data points for each data point included in the tentative peak data 154 (FIG. 2). At step S203, the peak classification module 120 (FIG. 2) sets data points with the calculated distance data into a temporal data structure created on the memory coupled to the processing unit.

In the present embodiment, the distance is defined as a horizontal interval between adjacent data points. Distance data may include a plurality of data points each having an index that may be successively assigned to the data point from start to end in the input data 152 (FIG. 2) or the independent variable, the dependent variable and the calculated distance between the data points and the neighboring data points.

The distance may be measured as a difference of the index or as a difference of the independent variable in a certain scale between the adjacent data points. For instance, assuming that there are two neighboring peaks at indices 3 (0.25 MHz) and 88 (4.5 MHz) in the input data 152 (FIG. 2), the distance from the first peak to the second peak may be calculated to be 85 (4.25 MHz). For the last data point in the tentative peak data 154 (FIG. 2), the distance may be set to a special value such as zero such that the last data point is not removed by the subsequent clustering analysis.

Typically, the peaks of the slow fluctuation data in the waveform data are expected to be distant from each other with respect to the horizontal axis. Meanwhile, even after the removal based on the smoothing technique by the peak extraction module 110 (FIG. 2) described above, noise owing to rapid fluctuations may still remain around peaks representing slow fluctuations in the tentative peak data 154 (FIG. 2). As may be known by those skilled in the art, the gathering degree of the peaks may be expected to be clearly divided with respect to the horizontal axis. Therefore, it may be worth trying to classify the tentative peaks based on the gathering degree using the clustering analysis. As such, the clustering may be performed with respect to the distance on the horizontal axis as will be described in detail below.

At step S204, the peak classification module 120 (FIG. 2) creates random seeds for the clustering analysis. The number of random seeds may be, for example, a default value provided by an expert or designated by the user as an argument. During a loop from step S205 through step S210, the peak classification module 120 (FIG. 2) performs the clustering analysis with each random seed that is created at step S204.

At step S206, the peak classification module 120 (FIG. 2) divides the data points in the distance data into two clusters by the clustering analysis based on the distance. The clustering analysis may include any clustering analysis known in the art such as, for example, a k-means clustering algorithm. The k-means clustering algorithm is the simplest algorithm among other clustering techniques and allows for a quick execution. Thus, in a preferred embodiment, the k-means algorithm may be used as the clustering technique for the peak classification process.

After the primary peak extraction process, the data points at the upper side of the final smooth curve remain. The remaining data points gradually become closer to peaks. However, as shown in FIG. 4D, it may be detected that extra data points remain in the vicinity of the peaks.

FIG. 6A shows a distance between the tentative peaks classified by the peak classification process described above, according to an embodiment of the present invention. It should be noted that the distance on the horizontal axis between closely positioned extra data points are expected to be substantially small. On the other hand, the distance between data points representing a waveform feature are expected to be large. Also, the amplitude of the data point may be generally unreliable for clustering. Therefore, focusing merely on the distance between tentative peaks may result in a reasonable cluster as illustrated in FIG. 6A.

With continued reference to FIG. 5, at steps 207A and 207B, the peak classification module 120 (FIG. 2) generates a cluster including distant data points (hereinafter "big distance cluster") and another cluster including closely positioned data points (hereinafter "small distance cluster"), respectively. With respect to the distance on the horizontal axis, the data points having larger distance and remaining data points having shorter distances may be classified into the big distance cluster and the small distance cluster, respectively.

As for the last data point in the distance data, the distance may be set equal to a special value such as zero. Since the last data has survived through the multiple removal processes during the peak extraction process, the last data point may be treated as one of the dominant peaks. Thus, the last data point with the special value may be incorporated into the big distance cluster.

At steps 208A and 208B, the peak classification module 120 (FIG. 2) obtains a minimum value of the distance in the big distance cluster and a maximum value of the distance in the small distance cluster, respectively. At step 209, the peak classification module 120 (FIG. 2) calculates separation between the big and small distance clusters. In the present embodiment, the separation may be defined as a separation between the minimum value of the distance in the big distance cluster and the maximum value of the distance in the small distance cluster as shown in FIG. 6A. It should be noted that the definition of the separation may be different from a distance between clusters (FIG. 6A), in some embodiments, the separation may include, for example, a distance of the centroid in a context of the clustering analysis.

When the loop from step S205 through step S210 has been executed for all random seeds, the process proceeds to step S211. At step S211, the peak classification module 120 (FIG. 2) determines whether the process needs further analysis.

It should be noted that, typically, distances between data points are observed separately at large and small distance regions. As shown in FIG. 6A, the data points in the tentative peak data 154 (FIG. 2) may be divided in two clusters including the big distance cluster and the small distance cluster. Therefore, in embodiments in which the k-means clustering analysis is used, the randomness of the initial value generally does not become an obstructive factor for the clustering result.

However, in some cases, the distance may not be clearly divided. In such cases, the member constitution of the clusters may be different for each execution of the clustering. Therefore, in the present embodiment, the peak classification module 120 (FIG. 2) determines the member constitution of the clusters by using the random seeds generated at step S204.

If the separations calculated from all random seeds are identical, the peak classification module 120 (FIG. 2) may determine that the process does not need further analysis. Alternatively, if constitutions of the clusters obtained from all random seeds are identical, the peak classification module 120 (FIG. 2) may determine that the process does not need further analysis. If the peak classification module 120 (FIG. 2) determines that the process does not need further analysis in the step S211 (NO), the process branches to step S213. At step S213, the peak classification module 120 (FIG. 2) outputs the cluster data 156 (FIG. 2) including the big and small distance clusters that is obtained based on any one of the random seeds (e.g., first random seed of 20 seeds).

If any of the calculated separations is not identical to the others, the peak classification module 120 (FIG. 2) may determine that the process needs further analysis. Alternatively, if a plurality of member constitutions is obtained, the peak classification module 120 may determine that the process needs further analysis. In this case, there may be a plurality of member constitutions of the big and small distance clusters, depending on the initial condition, which may indicate instability in the segmentation of the clusters. If the peak classification module 120 (FIG. 2) determines that the process needs further analysis in step S211 (YES), the process branches to step S212.

At step S212, the peak classification module 120 (FIG. 2) performs further analysis based on the result obtained at this step. In one embodiment, the peak classification module 120 (FIG. 2) may select a combination of the big and small distance clusters based on the number of the members in the small distance cluster. For example, the peak classification module 120 (FIG. 2) selects the random seed that results in the smallest number of members in the small distance cluster such that the big distance cluster retains as many data points as possible. In this case, the peak classification module 120 (FIG. 2) may again execute clustering analysis with the selected seeds and then determine a constitution of the big and small distance clusters.

In one embodiment, the peak classification module 120 (FIG. 2) may select a combination of the big and small distance clusters based on the calculated separation between the clusters. For example, the peak classification module 120 (FIG. 2) selects the seed that results in the largest separation between the clusters. Consequently, the clustering analysis is executed repeatedly such that the boundary of the clusters becomes clear. In another embodiment, the peak classification module 120 (FIG. 2) may select a constitution of the clusters based on the calculated separation between the clusters by combining the number of members in the small distance cluster.

In yet another embodiment, the peak classification module 120 (FIG. 2) may further classify the data points of the small distance cluster in two clusters. FIG. 6B shows a case where data points in the tentative peak data 154 (FIG. 2) are divided in clusters including the primary big distance cluster (white circles in FIG. 6B), and the secondary larger and smaller distance clusters of the primary small distance cluster (gray diamonds and solid triangles in FIG. 6B, respectively). The secondary processing, in which data points in the primary small distance cluster are further divided will be described in detail below.

When the processing in step S212 has been finished, the process proceeds to step S213. At step S213, the peak classification module 120 (FIG. 2) outputs the cluster data 156 (FIG. 2) including the clusters obtained by further analysis of the data points at step S212.

FIG. 6C shows the tentative peaks on the waveform data classified by the secondary peak classification process. As may be understood from FIG. 6C, the data points in the small distance cluster may not include any peak in the input waveform data. FIG. 6C shows the case where the data points in the tentative peak data 154 (FIG. 2) are divided in three clusters. It should be noted that the case where data points are divided in two clusters may also show similar results as those of FIG. 6C.

It should also be noted that data points classified as big distance cluster may not be treated as dominant peaks directly. As described below, the data point having the highest value on the vertical axis among the extracted data points may be determined as dominant peaks by the peak determination process described in detail below.

Figure 7:
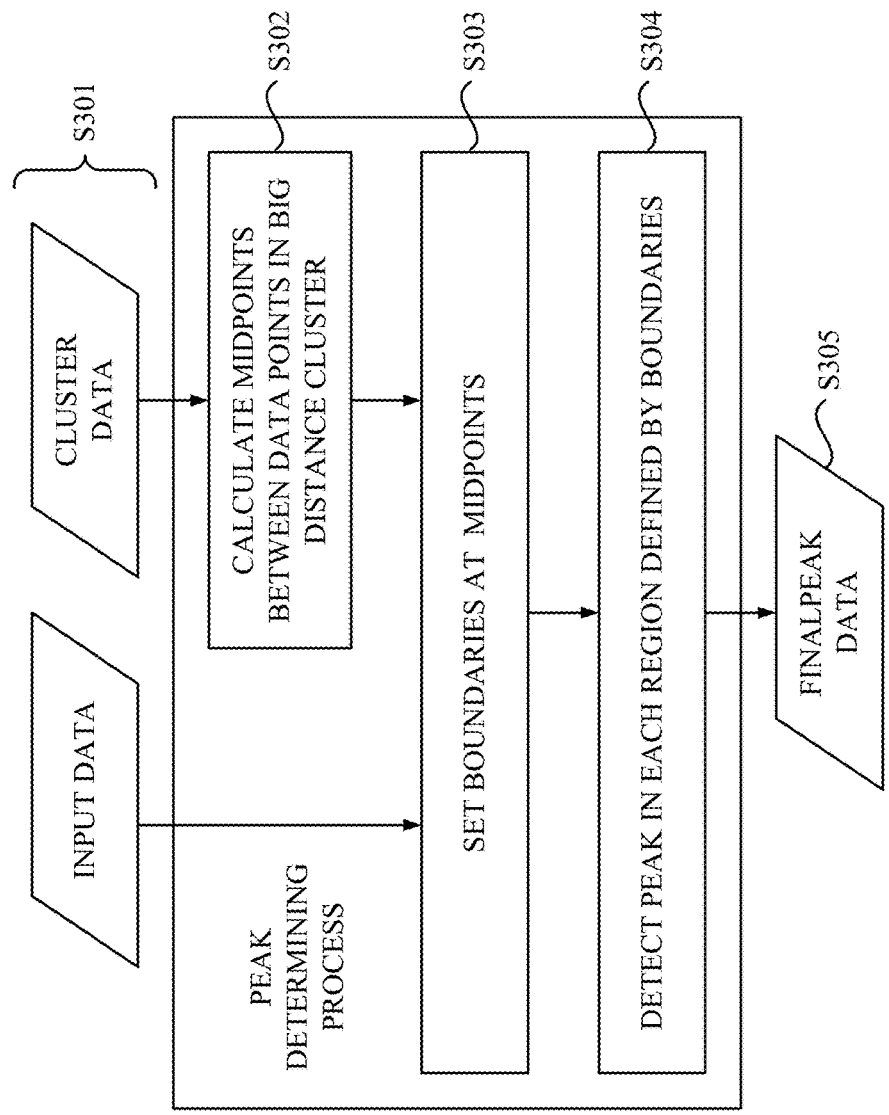
FIG. 7 is a flowchart depicting a tertiary peak determination process in the novel peak detection process, according to an embodiment of the present invention.

Referring now to FIG. 7, a flowchart depicting a tertiary peak determination process in the novel peak detection process of FIG. 2 is shown, according to an embodiment of the present invention. It should be noted that the peak determination process shown in FIG. 7 may be performed by a processing unit that implements the peak determination module 130 shown in FIG. 2.

The process shown in FIG. 7 begins after the process shown in FIG. 5 is finished. At step S301, the peak determination module 130 (FIG. 2) receives the input data 152 (FIG. 2) and the cluster data 156 (FIG. 2) from the peak classification module 120 (FIG. 2). At step S302, the peak determination module 130 (FIG. 2) calculates midpoints between adjacent data points for each data point in the big distance cluster included in the cluster data 156 (FIG. 2).

At step S303, the peak determination module 130 (FIG. 2) sets boundaries at each calculated midpoints on the input data 152 (FIG. 2). FIG. 8A shows boundaries set by the peak determination process on the waveform data. As shown in FIG. 8A, the boundaries are set between the distant data points of the cluster.

At step S304, the peak determination module 130 (FIG. 2) detects an extreme from the input data 152 (FIG. 2) within each region defined by the adjacent boundaries. FIG. 8B shows finally detected peaks by the peak determination process shown in FIG. 7. The final peaks are detected at step S305 as maximum points in each region defined by the boundaries, as can be appreciated in FIG. 8B. Therefore, in the present embodiment, the big distance cluster provided by the peak classification module 120 (FIG. 2) may provide ranges where each dominant peak representing slow fluctuations with highest amplitude are expected to appear.

In this embodiment, the one or more dominant peaks may be detected from the input data 152 (FIG. 2), as described above the input data 152 (FIG. 2) may fluctuate with respect to an independent variable due to certain reasons and may show one or more peaks with certain technical significance as a part of a whole peak, as such the one or more peaks may be determined without relying on individual technical skills.

In this embodiment, the definite peaks and the peaks of the envelope representing slow fluctuations, which may give a clue for identifying a noise source, may preferably be detected while background noise fluctuations (with low level and rapid fluctuations) that may form an envelope but not correspond to the peak of the envelope are ignored. Furthermore, even if the observed waveform includes several types of slow fluctuations due to presence of a plurality of different noise sources, data points located close to the dominant peak, which may represent neighboring extra peaks around the dominant peak, may be preferably ignored to focus on the dominant peaks having technical significant.

It should be noted that, in this embodiment, the parameters and the number of the iterations of the removal process in the peak extraction process are designated by a user or fixed to a default value.

In this embodiment, the peak extraction module 110 (FIG. 2) is configured to perform the removal of data points corresponding to background noise fluctuations repeatedly with each estimated optimal parameter until a termination condition is satisfied. In some cases, a second order derivative of a count of remaining data points after removal may be used as metric in the termination condition. The removal of the data points may be repeated until the second order derivative becomes negative. In each removal process, the peak extraction module 110 estimates an optimal parameter by maximizing the count of the remaining data points after the removal with respect to the parameter of the smoothing technique.

The peak classification module 120 (FIG. 2) is configured to divide the extracted data points in two clusters including the big distance cluster and small distance cluster, and to determine whether further division is required or not. If the peak classification module 120 (FIG. 2) determines that additional division is required, the peak classification module 120 (FIG. 2) further divides the data points of the primary small distance cluster in two cluster including secondary larger and smaller distance clusters. Then, the peak classification module 120 (FIG. 2) merges the primary big distance cluster and the secondary larger distance cluster of the primary small distance cluster as the cluster of the distant data points. The peak determination module 130 (FIG. 2) is configured to determine one or more dominant peaks in the input data 152 (FIG. 2) based on the cluster data 156 (FIG. 2) including the cluster of the distant data points.

Another way of performing a primary peak process in the novel peak detection process of FIG. 2 will be described in detail below with reference to FIGS. 9-11.

Figure 9:
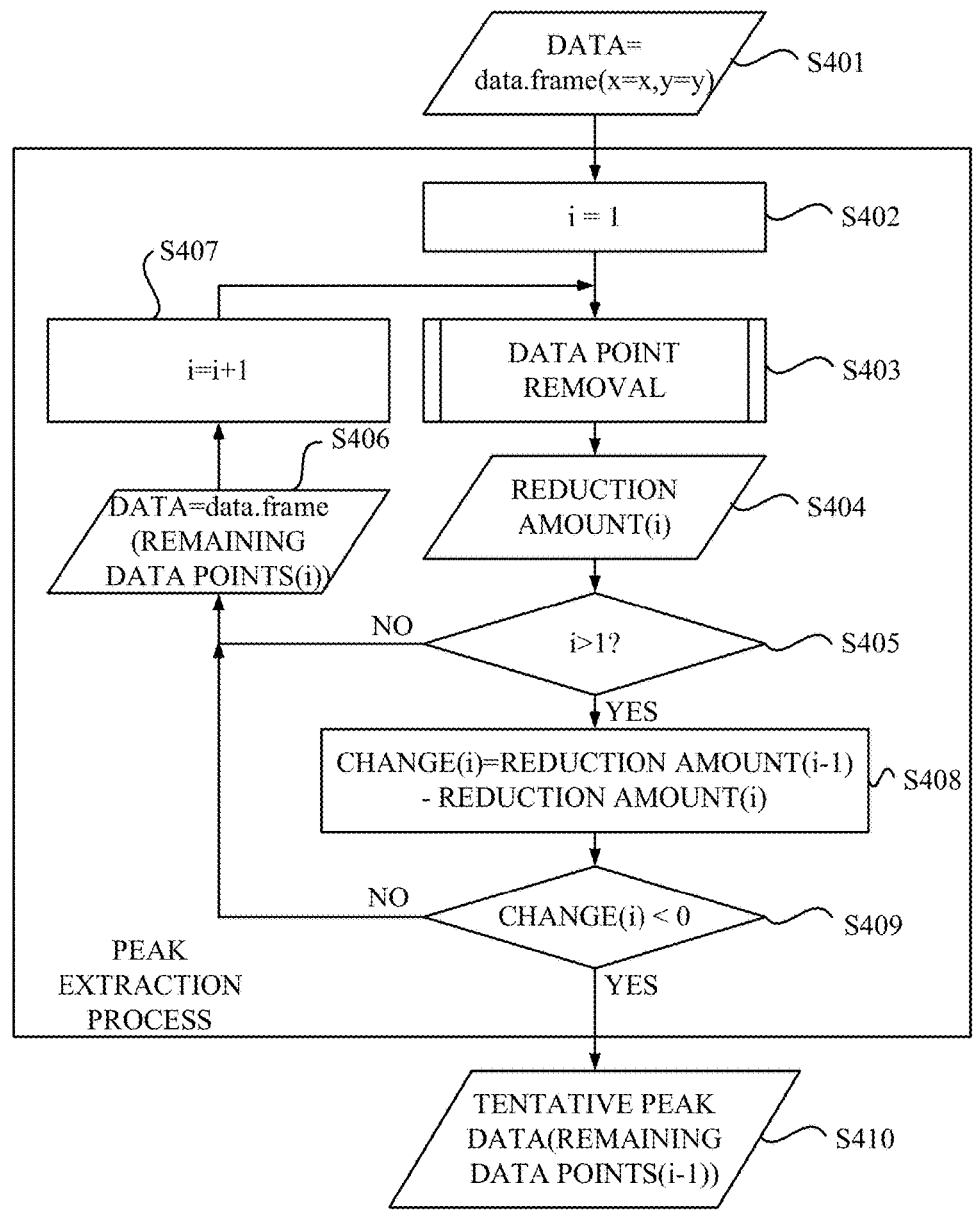
FIG. 9 is a flowchart depicting a primary peak extraction process in a novel peak detection process, according to an embodiment of the present invention.
Figure 10:
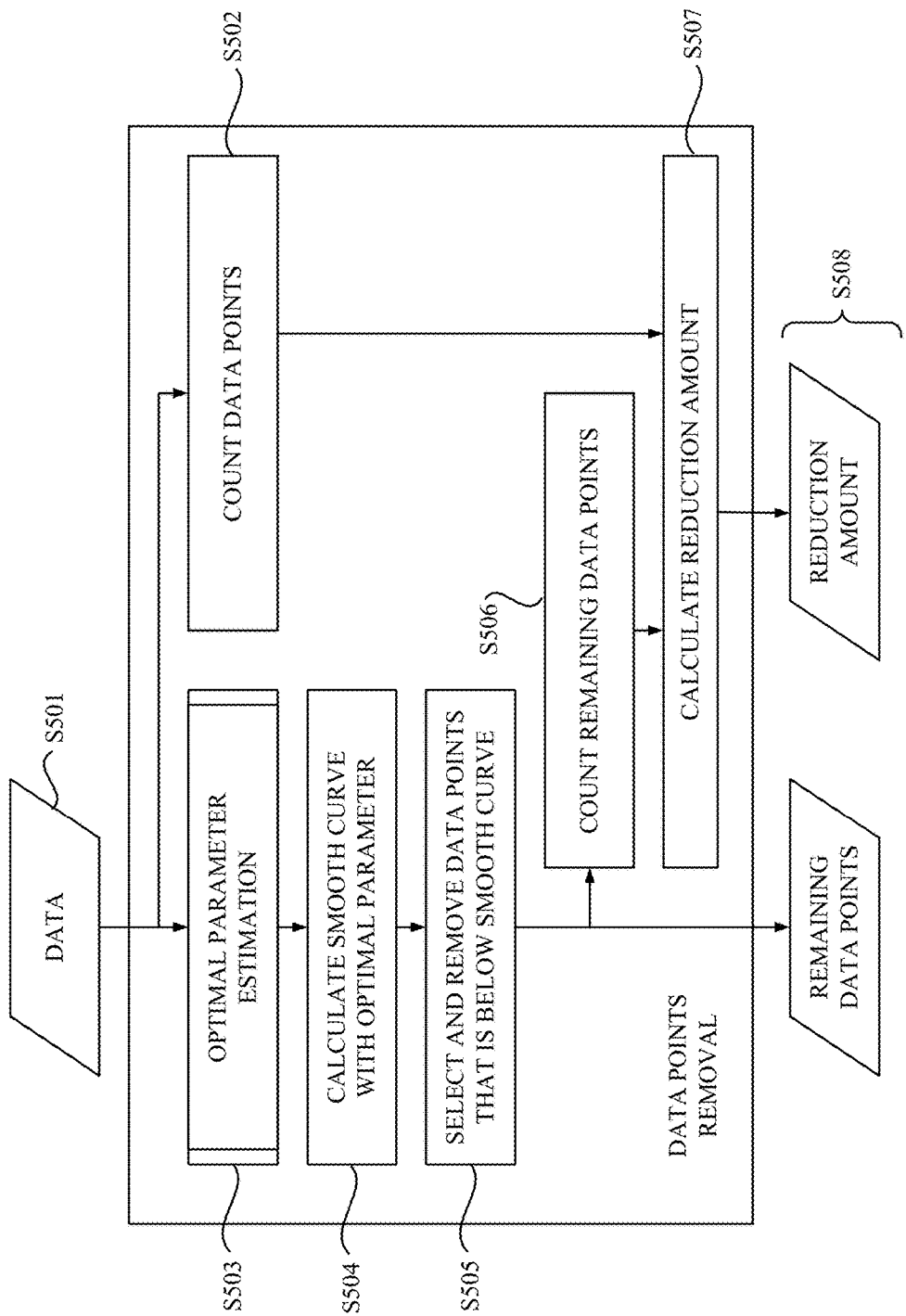
FIG. 10 is a flowchart depicting a data point removal process in the primary peak extraction process according to an embodiment of the present invention.
Figure 11:
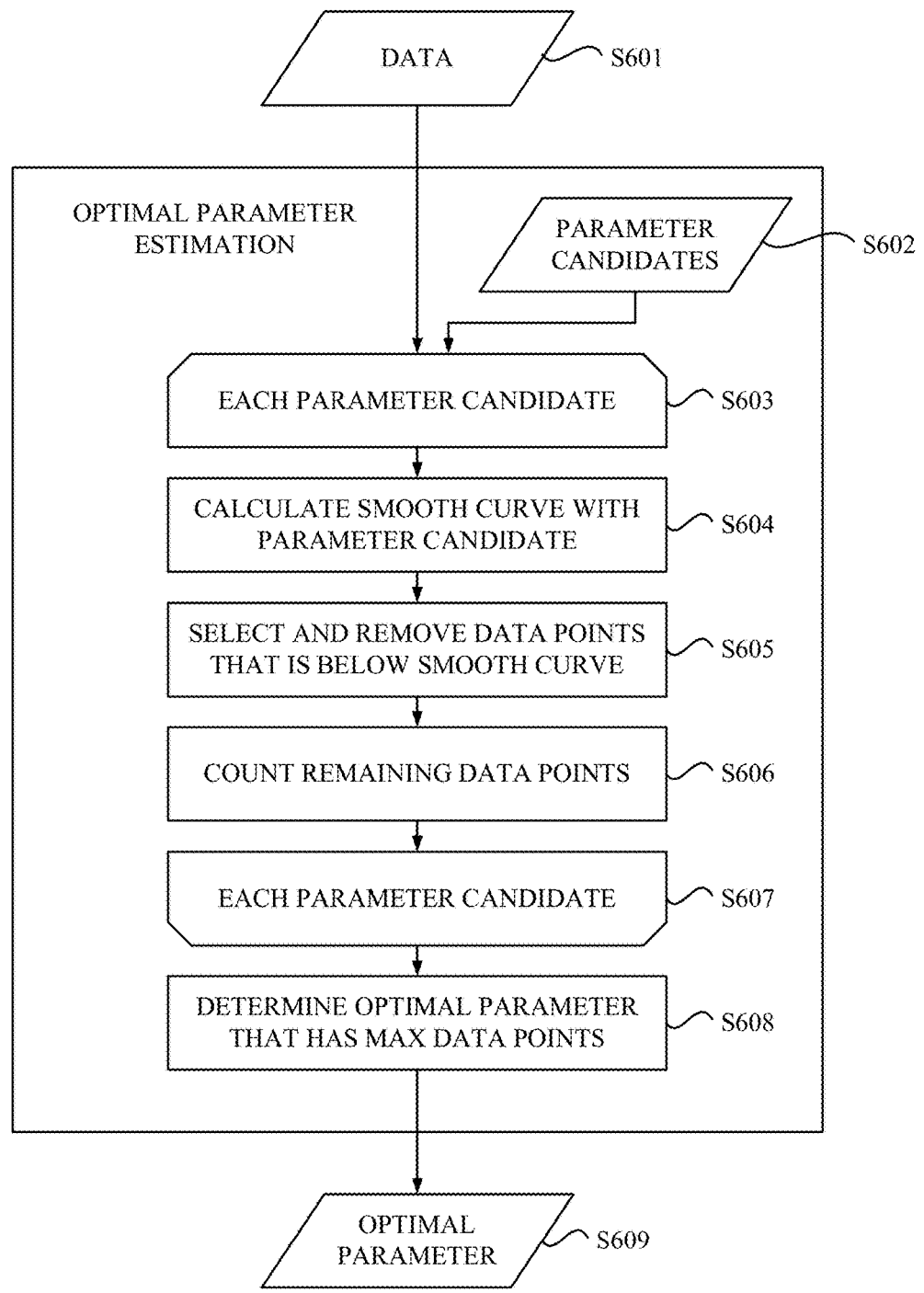
FIG. 11 is a flowchart depicting an optimal parameter estimation process in the data point removal process, according to an embodiment of the present invention.

Referring now to FIGS. 9-11, an alternate primary peak extraction process is described according to an embodiment of the present invention. In this embodiment, FIG. 9 shows flowchart depicting a main routine of the alternate primary peak extraction process using the novel peak detection process of FIG. 2; FIG. 10 shows a flowchart depicting a data point removal process in the alternate primary peak extraction process; and FIG. 11 shows a flowchart depicting an optimal parameter estimation process in the data point removal process. It should be noted that the alternate peak extraction process shown in FIGS. 9-11 may be performed by a processing unit that implements the peak extraction module 110 shown in FIG. 2.

The process shown in FIG. 9 begins in response to receiving a request for peak detection with designated input data 152 (FIG. 2). At step S401, the peak extraction module 110 (FIG. 2) reads the input data 152 (FIG. 2) and sets the input data 152 (FIG. 2) into a temporal data structure. At step S402, the peak extraction module 110 (FIG. 2) initializes an iteration index. At step S403, the peak extraction module 110 (FIG. 2) calls the data point removal process shown in FIG. 10. The data in the temporal data structure may be passed to the data point removal process.

The process shown in FIG. 10 begins in response to the process at step S403 shown in FIG. 9. At step S501, the data point removal process receives the data in the temporal data structure. At step S502, the peak extraction module 110 (FIG. 2) counts the number of the data points in the received data. At step S503, the peak extraction module 110 (FIG. 2) calls the optimal parameter estimation process shown in FIG. 11. The data in the temporal data structure may be passed to the optimal parameter estimation process.

The process shown in FIG. 11 begins in response to the process at step S503 shown in FIG. 10. At step S601, the optimal parameter estimation process receives the data in the temporal data structure. At step S602, the peak extraction module 110 (FIG. 2) reads parameter candidates. The parameter candidates may be predetermined values in a certain range of a parameter (e.g. span=c (0.01, 0.02, 0.03, . . . , 0.49, 0.5)).

During a loop from step S603 through step S607, the peak extraction module 110 (FIG. 2) performs a trial of data point removal process with each parameter candidate prepared at step S602 for given data received at step S601.

At step S604, the peak extraction module 110 (FIG. 2) calculates a smooth curve with the parameter candidate. At step S605, the peak extraction module 110 (FIG. 2) selects data points below the smooth curve and removes the selected data points. At step S606, the peak extraction module 110 (FIG. 2) counts the number of the remaining data points after the current trial.

Figures 12A, 12B:
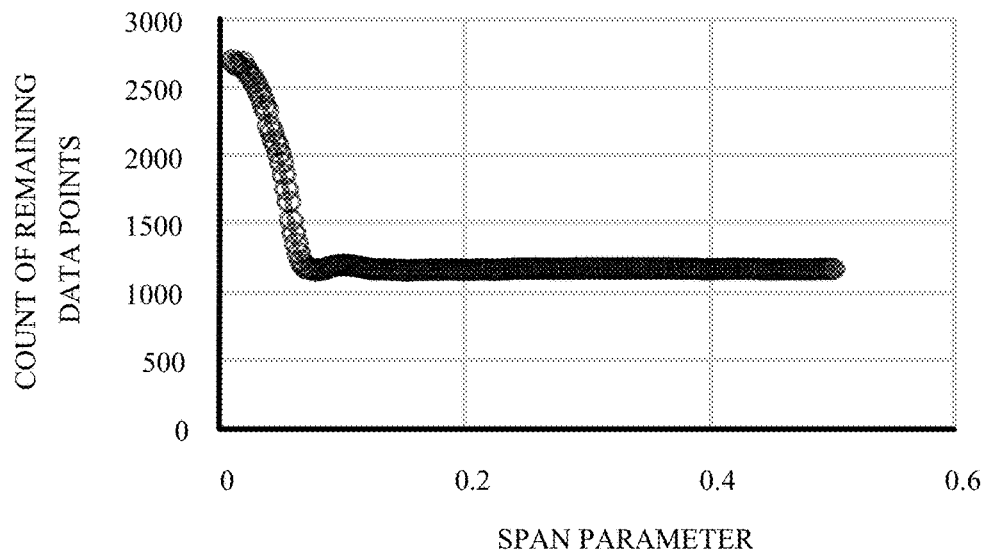
FIG. 12A shows an example of counts of remaining data points after removal over a range of parameter during the optimal parameter estimation process, according to an embodiment of the present invention.
FIG. 12B shows a history of a second order derivative during the peak extraction process, according to an embodiment of the present invention.

When the loop from step S603 through step S607 has executed for all parameter candidates, the process proceeds to step S608. At step S608, the peak extraction module 110 (FIG. 2) determines a parameter that maximizes the number of the remaining data points after the trial as the optimal parameter. At step S609, the process returns the estimated optimal parameter and ends the process. FIG. 12A shows an example of the counts of the remaining data points after removal over a range of the span parameter during the optimal parameter estimation process.

With continued reference to FIG. 10, when the process shown in FIG. 11 finishes, the process proceeds to step S504. At step S504, the peak extraction module 110 (FIG. 2) calculates a smooth curve with the estimated optimal parameter. At step S505, the peak extraction module 110 (FIG. 2) selects data points that are below the smooth curve and removes the selected data points from the received data.

At step S506, the peak extraction module 110 (FIG. 2) counts the number of the remaining data points after the current removal. At step S507, the peak extraction module 110 (FIG. 2) calculates the reduction amount of the current removal. The reduction amounts may be defined as difference between the number of the data points before the removal and the number of the data points after the removal, which are counted at step S502 and S506, respectively. At step S508, the data point removal process returns the remaining data point after the step S505 and the reduction amount calculated at step S507, and ends the process.

Referring back to FIG. 9, when the process shown in FIG. 10 finishes, the process proceeds to step S404. At step S404, the process obtains the reduction amount by the current removal. At step S405, the peak extraction module 110 (FIG. 2) determines whether the iteration index is greater than one, indicating the second or later removal processes. If the peak extraction module 110 (FIG. 2) determines that the iteration index is equal to one, then the process branches to step S406. At step S406, the peak extraction module 110 (FIG. 2) sets the currently remaining data point after the data point removal process at step S403 as input for further removal process, increments the iteration index at step S407 and loops back to step S403 for further removal.

If the peak extraction module 110 (FIG. 2) determines that the iteration index is greater than one, then the process branches to step S408. At step S408, the peak extraction module 110 (FIG. 2) calculates a change of the reduction amount from previous removal process. The change may be calculated as difference between the reduction amount of the previous removal process (i−1) and the reduction amount of the current removal process (i). The calculated change is identical to a second order derivative of the count of the remaining data points after removal.

At step S409, the peak extraction module 110 (FIG. 2) determines whether the change becomes negative or not. If the peak extraction module 110 (FIG. 2) determines that change has not become negative yet in the step S409 (NO), then the process branches to step S406 for further removal. If the peak extraction module 110 (FIG. 2) determines that the change has become negative in step S409 (YES), then the process branches to step S410. At step S410, the peak extraction module 110 (FIG. 2) outputs the tentative peak data 154 (FIG. 2) that includes the remaining data points in the temporal data structure after the previous removal and ends the process.

FIG. 12B shows an example of a history of the second order derivative of the remaining data points during the peak extraction process described above. As shown in FIG. 12B, since the second order derivative becomes negative at iteration #7, the peak extraction module 110 (FIG. 2) outputs the remaining data points after iteration #6.

Figure 13:
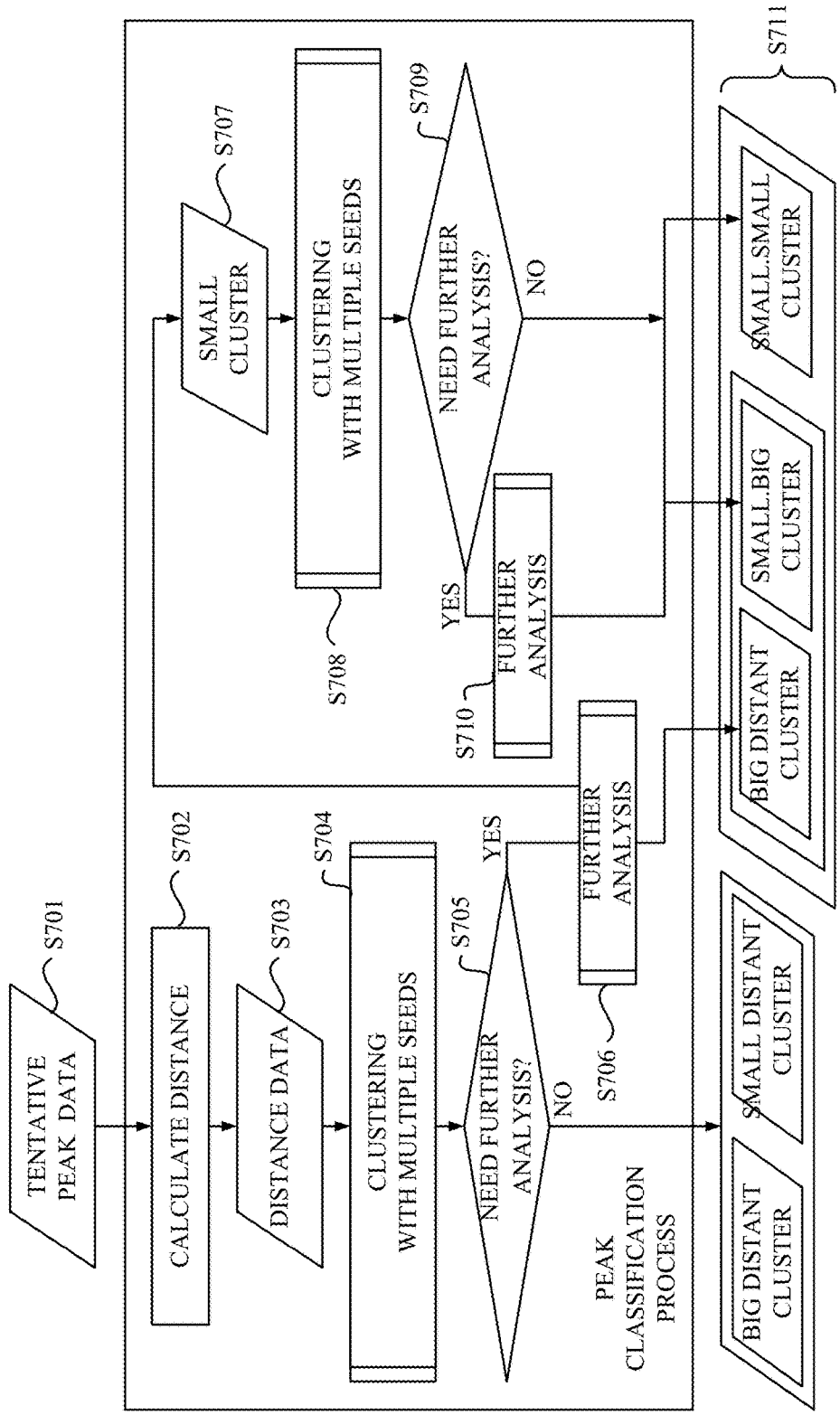
FIG. 13 is a flowchart depicting a secondary peak classification process in the novel peak detection process, according to an embodiment of the present invention.
Figure 14:
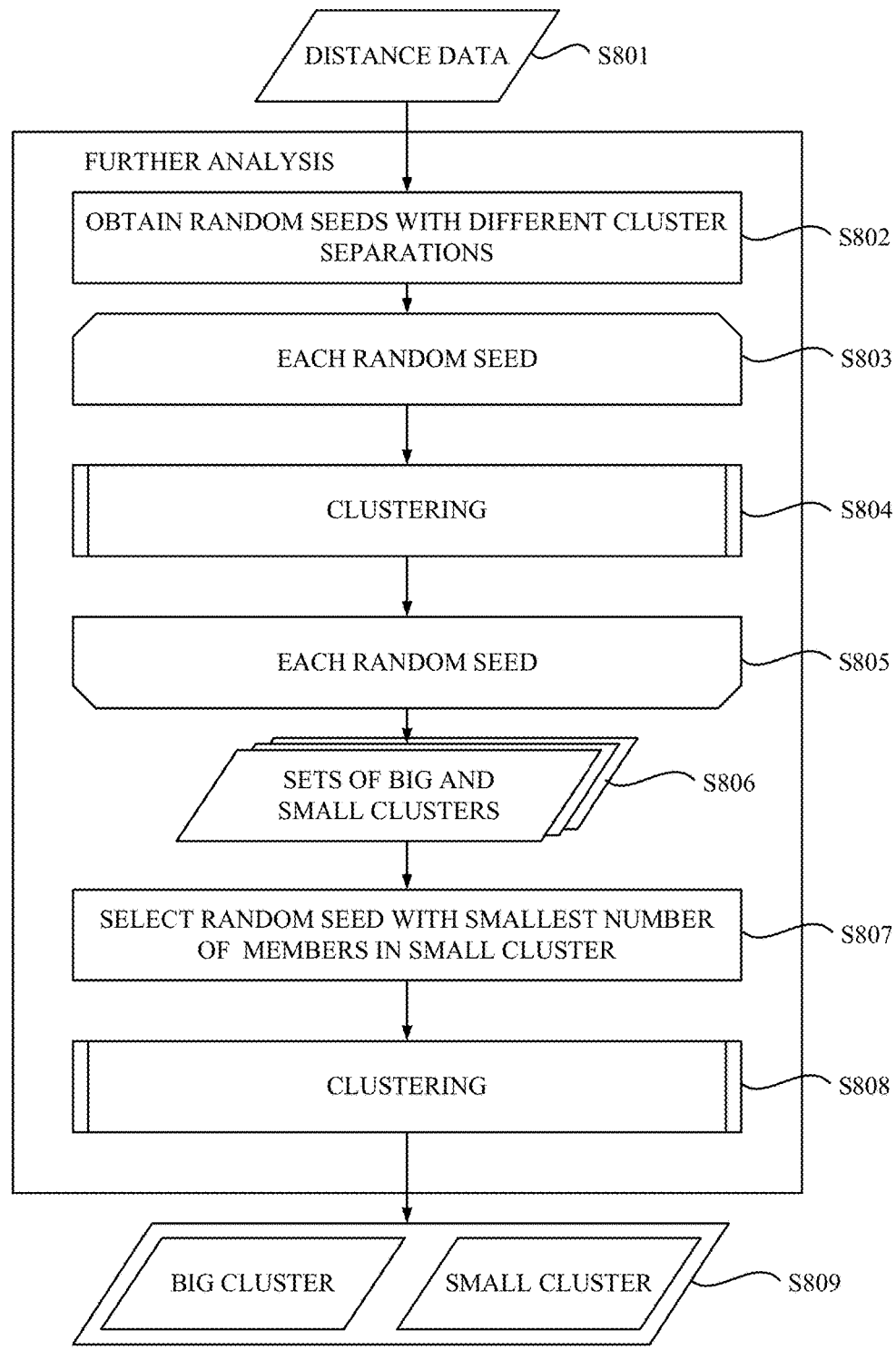
FIG. 14 is a flowchart depicting a further analysis process in the secondary peak classification process, according an embodiment of the present invention.

Referring now to FIGS. 13-14, a secondary peak classification process in the novel peak detection process of FIG. 2 is described, according to an embodiment of the present invention. In this embodiment, FIG. 13 shows a flowchart depicting a main routine of the secondary peak classification process; and FIG. 14 shows a flowchart depicting a detailed process for further analysis in the secondary peak classification process. It should be noted that the peak classification process shown in FIGS. 13-14 may be performed by a processing unit that implements the peak classification module 120 shown in FIG. 2.

The process shown in FIG. 13 begins after the process shown in FIG. 9 is finished. At step S701, the peak classification module 120 (FIG. 2) receives the tentative peak data 154 (FIG. 2) from the peak extraction module 110 (FIG. 2). At step S702, the peak classification module 120 (FIG. 2) calculates distance between adjacent data points for each data point included in the tentative peak data 154 (FIG. 2). At step S703, the peak classification module 120 (FIG. 2) sets the data points with the calculated distance data into the temporal data structure.

At step S704, the peak classification module 120 (FIG. 2) performs clustering with multiple seeds, that is identical to the processes from step S201 through step S210 shown in FIG. 5. At step S705, the peak classification module 120 (FIG. 2) determines whether the process needs further analysis.

If the separations calculated by using all random seeds are identical, the peak classification module 120 (FIG. 2) may determine that the process does not need the further analysis. If the peak classification module 120 (FIG. 2) determines that the process does not need further analysis in the step S705 (NO), the process branches to step S711. At step S711, the peak classification module 120 (FIG. 2) outputs the cluster data 156 (FIG. 2) that includes the big and small distance clusters, which is obtained based on any one of the random seeds.

If any one of the separations is not identical to others, the peak classification module 120 (FIG. 2) may determine that the process needs further analysis. If the peak classification module 120 (FIG. 2) determines that the process needs further analysis in the step S705 (YES), the process branches to step S706. At step S706, the peak classification module 120 (FIG. 2) calls the further analysis shown in FIG. 14.

The process shown in FIG. 14 begins in response to the process at step S706 (or step S710) shown in FIG. 13. At step S801, the peak classification module 120 (FIG. 2) receives the distance data. At step S802, the peak classification module 120 (FIG. 2) obtains the random seeds which give different separations at step S704. During a loop from step S803 through step S805, the peak classification module 120 (FIG. 2) performs the clustering analysis (S804) that is identical to the processes from step S206 through step S209 shown in FIG. 5 with each random seed obtained at step S802.

When the loop from step S803 through step S805 has been executed for all obtained random seeds with different separations, the process proceeds to step S806. At step S806, the peak classification module 120 (FIG. 2) obtains a plurality of clustering results, each of which includes the big and small distance clusters.

At step S807, the peak classification module 120 (FIG. 2) selects the random seed that results in the least number of members in the small distance cluster. At step S808, the peak classification module 120 (FIG. 2) executes again the clustering analysis with selected seeds. At step S809, the process returns the cluster data 156 (FIG. 2) including the big and small distance clusters of the input distance data and ends the process.

Referring back to FIG. 13, by performing the further analysis at step S706, the big distance cluster and the small distance cluster are obtained. At step S707, the peak classification module 120 (FIG. 2) sets the data points with the distance data in the small distance cluster into the temporal data structure.

At step S708, the peak classification module 120 (FIG. 2) performs the clustering on the data points of the small distance cluster with multiple seeds similarly to the processes from step S201 through step S210 described in FIG. 5. The difference between the processes at step S704 and S708 is merely the target of the clustering analysis. At step S709, the peak classification module 120 (FIG. 2) determines whether the process needs further analysis.

If the peak classification module 120 (FIG. 2) determines that the process does not need further analysis in the step S709 (NO), the process branches to step S711. At step S711, the peak classification module 120 (FIG. 2) outputs the cluster data 156 (FIG. 2) including the big distance cluster, and a larger distance cluster (small.big.cluster in FIG. 13) and a smaller distance cluster among the small distance cluster (small.small.cluster in FIG. 13) which are obtained based on any of the random seeds.

If any of the separations is not identical to the others, the peak classification module 120 (FIG. 2) may determine that the process needs the further analysis. If the peak classification module 120 (FIG. 2) determines that the process needs further analysis in the step S709 (YES), the process branches to step S710. The process shown in FIG. 14 is performed on the data points in the primary small distance cluster. By performing the further analysis at step S710 the larger distance cluster and the smaller distance cluster of the primary small distance cluster are obtained. At step S711, the peak classification module 120 (FIG. 2) outputs the cluster data 156 (FIG. 2) that includes the big distance cluster and the larger distance cluster (small.big.cluster in FIG. 13) and the smaller distance cluster (small.small.cluster in FIG. 13) of the primary small distance cluster.

In this case, the big distance cluster and the larger distance cluster divided from the small distance cluster (small.big-.cluster in FIG. 13) may be merged for further peak determination process. The merged cluster of the distant data points are discriminated from closely positioned data points, which may be ignored by subsequent peak determination process by regarding as noises of the waveform.

It should be noted that the tertiary peak determination process in the novel peak detection process is identical to that of the aforementioned exemplary embodiments.

In the present embodiment, the one or more dominant peaks may be detected from the input data 152 (FIG. 2) without relying on individual technical skills for determining the parameter and the number of iterations for the data point removal process.

Also, the definite peaks and the peaks of the envelope, which may give a clue for identifying a noise source, may be preferably detected without designating the parameter and the number of iterations for the data point removal process.

Experimental studies were performed using a program implementing the system and process described above with reference to FIGS. 2-14. The program was coded and executed for given test data sets including pseudo data that imitates EMI spectrum. The LOESS smoothing and the k-means algorithm were employed as the smoothing technique and the clustering analysis in the peak extraction and classification processes, respectively.

Ten sets of the pseudo data each having 1998 data points were prepared by using following equation:

$$y = \max(y1, y2)$$

where $$y1 = \begin{cases} \left|\log10\left(\left|a1 * \left|\frac{\sin(b1*f)}{b1*f}\right|\right|\right)\right| / f & \text{if } (base1*\text{integer} - 0.025 < \\ & f <= base1*\text{integer} + 0.025) \\ 0 & \text{else} \end{cases}$$

$$y2 = \begin{cases} \left|\log10\left(\left|a2 * \left|\frac{\sin(b2*f)}{b2*f}\right|\right|\right)\right| / f & \text{if } (base2*\text{integer} - 0.025 < \\ & f <= base2*\text{integer} + 0.025). \\ 0 & \text{else} \end{cases}$$

The aforementioned equation may simulate broadband noise including a plurality of components of slow fluctuation. The parameters used in the aforementioned equation are summarized following Table 1 below:

TABLE 1

| data # | #1 | #2 | #3 | #4 | #5 | #6 | #7 | #8 | #9 | #10 |
|---|---|---|---|---|---|---|---|---|---|---|
| base1 | 0.15 | 0.18 | 0.2 | 0.2 | 0.15 | 0.15 | 0.8 | 0.155 | 0.344 | 0.41 |
| base2 | 0.23 | 0.33 | 0.34 | 0.34 | 0.19 | 0.19 | 0.6 | 0.166 | 0.388 | 0.42 |
| a1 | 0.8 | 0.8 | 0.9 | 0.9 | 0.9 | 0.9 | 0.9 | 0.9 | 0.9 | 0.9 |
| b1 | 0.7 | 0.7 | 0.7 | 0.7 | 0.5 | 0.9 | 0.9 | 0.9 | 0.6 | 0.6 |
| a2 | 0.6 | 0.6 | 0.7 | 0.9 | 0.9 | 0.9 | 0.9 | 0.9 | 0.8 | 0.8 |
| b2 | 0.4 | 0.4 | 0.4 | 0.4 | 0.3 | 0.8 | 0.8 | 0.8 | 0.5 | 0.5 |

Ten sets of pseudo data were analyzed using the novel peak detection process described above with reference to FIGS. 2-14 (example 1). Conventional peak detection was performed using the "findpeak" function provided by Matlab® (comparative example 1 in Table 2), also conventional data thinning was used, in which a point having maximum amplitude was picked up in each thinning region designated by the number of data points (comparative examples 2-3 in Table 2).

In Example 1, the data point removal process was repeated a total of four times with a designated parameter. The span parameter of the LOESS smoothing for the first and the second data point removal processes was set to be 0.2. The span parameter for the third and the fourth data point removal processes was set to be 0.1. The clustering algorithm shown in FIGS. 13 and 14 were utilized. The distance was measured as a difference of the index for the sake of convenience, which was identical to the difference of the frequency in a linear scale. For the comparative example 1, the ten sets of pseudo data were subjected to the "findpeak" function a total of 3 times. In the comparative examples 2 and 3, the ten sets of the pseudo data were subjected to the data thinning by 50 and 40 data points, respectively.

The results obtained by the novel peak detection process, the conventional peak detection and the conventional data thinning are shown in Table 2. The results include overestimation and underestimation counts for the example comparative examples shown in Table 2 below.

TABLE 2

| | Total | | example 1 | | comparative example 1 | | comparative example 2 | | comparative example 3 | |
|---|---|---|---|---|---|---|---|---|---|---|
| data # | Peaks | over | under | over | under | over | under | over | under |
| #1 | 33 | 0 | 0 | 0 | 6 | 11 | 3 | 18 | 0 |
| #2 | 32 | 0 | 0 | 0 | 0 | 12 | 4 | 18 | 0 |
| #3 | 32 | 0 | 7 | 0 | 0 | 11 | 5 | 18 | 0 |
| #4 | 23 | 0 | 6 | 0 | 0 | 18 | 1 | 28 | 0 |
| #5 | 25 | 0 | 7 | 0 | 10 | 18 | 1 | 26 | 2 |
| #6 | 43 | 0 | 1 | 0 | 11 | 3 | 9 | 7 | 1 |
| #7 | 29 | 1 | 3 | 656 | 0 | 9 | 2 | 23 | 2 |
| #8 | 45 | 0 | 4 | 0 | 17 | 11 | 4 | 15 | 9 |
| #9 | 29 | 0 | 9 | 133 | 0 | 9 | 3 | 22 | 0 |
| #10 | 32 | 4 | 4 | 207 | 0 | 8 | 4 | 18 | 0 |

As shown in Table 2, the underestimations and the overestimations for the comparative example 1 were found to be considerably large in some cases. Note that when the conventional peak detection was performed one or two times, a large numbers was observed for the overestimations. The underestimations and overestimations of the comparative examples 2 and 3 were still large. Note that when the conventional data thinning was performed by 10-30 data points, still large numbers of the overestimations were observed. Also, the conventional methods used in the comparative examples required that the number of times to perform the "findpeak" function or the number of data points for data thinning were specified. On the other hand, the underestimations and overestimations in example 1 were relatively small in comparison to the comparative examples 1-3. As can be appreciated in Table 2, the novel peak detection process described above with reference to FIGS. 2-14 showed a comprehensive improvement when compared to traditional peak detection techniques.

Figure 15:
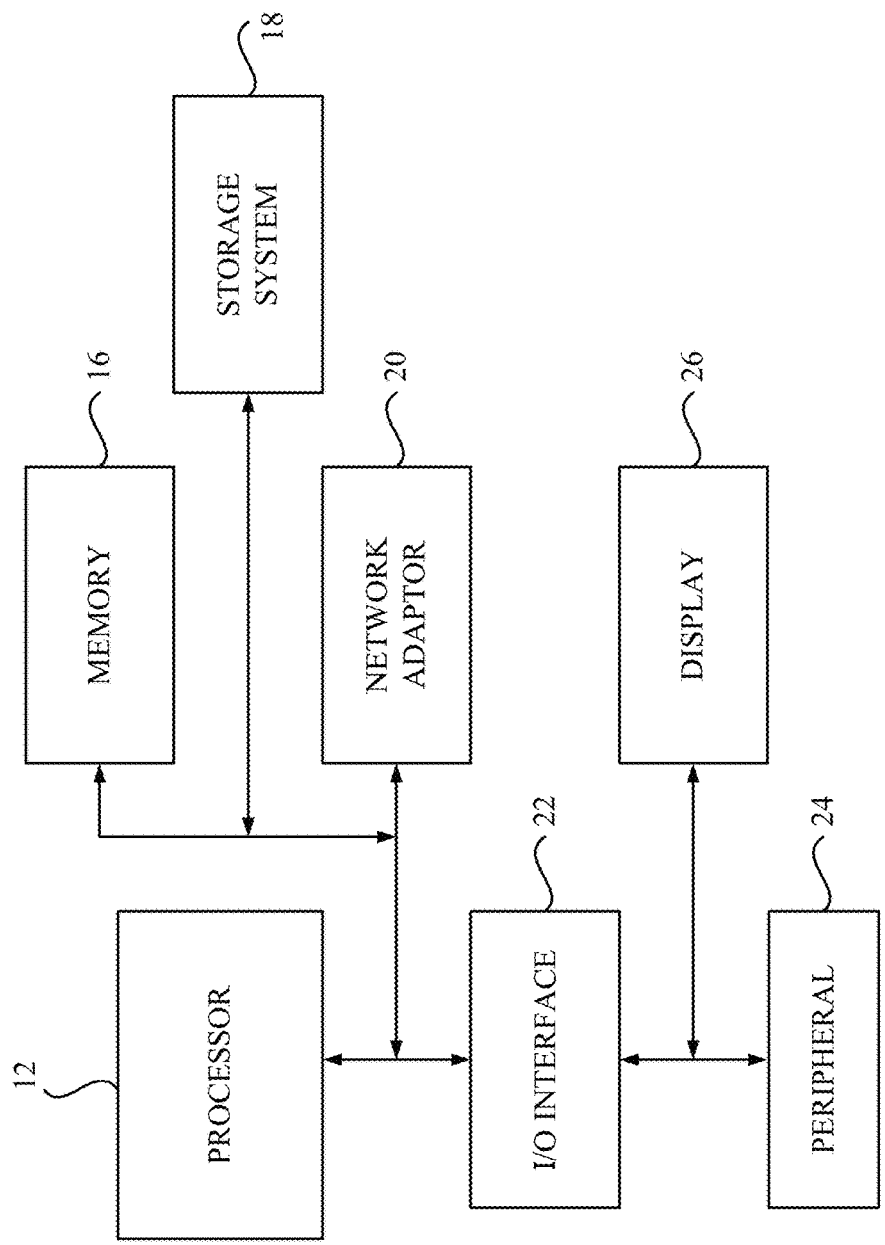
FIG. 15 depicts schematic of an exemplary computing device, according to an embodiment of the present invention.

Referring now to FIG. 15, a schematic of an exemplary computing device is shown, according to an embodiment of the present invention. The computing device shown in FIG. 15 is implemented as a general purpose computer system 10 (hereinafter "computer system"). The computer system 10 is only one example of a suitable computer system and is not intended to suggest any limitation as to the scope of use or functionality of embodiments of the invention described herein. Regardless, the computer system 10 is capable of being implemented and/or performing any of the functionality set forth hereinabove.

The computer system 10 is operational with numerous other general purpose or special purpose computing system environments or configurations. Examples of well-known computing systems, environments, and/or configurations that may be suitable for use with the computer system 10 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system 10 may be described in the general context of computer system-executable instructions, such as program modules, being executed by a computer system. Generally, program modules may include routines, programs, objects, components, logic, data structures, and so on that perform particular tasks or implement particular abstract data types.

As shown in FIG. 15, the computer system 10 is shown in the form of a general-purpose computing device. The components of the computer system 10 may include, but are not limited to, a processor (or processing unit) 12 and a memory 16 coupled to the processor 12 by a bus including a memory bus or memory controller, and a processor or local bus using any of a variety of bus architectures.

The computer system 10 typically includes a variety of computer system readable media. Such media may be any available media that is accessible by the computer system 10, and it includes both volatile and non-volatile media, removable and non-removable media.

The memory 16 can include computer system readable media in the form of volatile memory, such as random access memory (RAM). The computer system 10 may further include other removable/non-removable, volatile/non-volatile computer system storage media. By way of example only, the storage system 18 can be provided for reading from and writing to a non-removable, non-volatile magnetic media. As will be further depicted and described below, the storage system 18 may include at least one program product having a set (e.g., at least one) of program modules that are configured to carry out the functions of embodiments of the invention.

Program/utility, having a set (at least one) of program modules, may be stored in the storage system 18 by way of example, and not limitation, as well as an operating system, one or more application programs, other program modules, and program data. Each of the operating system, one or more application programs, other program modules, and program data or some combination thereof, may include an implementation of a networking environment. Program modules generally carry out the functions and/or methodologies of embodiments of the invention as described herein.

The computer system 10 may also communicate with one or more peripherals 24 such as a keyboard, a pointing device, etc.; a display 26; one or more devices that enable a user to interact with the computer system 10; and/or any devices (e.g., network card, modem, etc.) that enable the computer system 10 to communicate with one or more other computing devices. Such communication can occur via Input/Output (I/O) interfaces 22. Still yet, the computer system 10 can communicate with one or more networks such as a local area network (LAN), a general wide area network (WAN), and/or a public network (e.g., the Internet) via the network adapter 20. As depicted, the network adapter 20 communicates with the other components of the computer system 10 via bus. It should be understood that although not shown, other hardware and/or software components could be used in conjunction with the computer system 10.

Examples, include, but are not limited to: microcode, device drivers, redundant processing units, external disk drive arrays, RAID systems, tape drives, and data archival storage systems, etc.

The present invention may be a computer system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for analyzing noise spectrum of an electronic device, the method comprising:
   storing, in the memory device, a waveform data including a plurality of data points, wherein the waveform data is obtained by measuring a target signal from the electronic device;
   removing data points, from the plurality of data points in the waveform data, corresponding to a background noise fluctuation based on a smooth curve of the waveform data, such that the data points are extracted from the waveform data, wherein the extracted data points comprise candidates for peaks in the waveform data;
   estimating one or more optimal parameters by maximizing a count of remaining data points after removal with respect to a smoothing parameter, wherein removing the data points from the plurality of data points in the waveform data is repeated with each optimal parameter in the one or more optimal parameters until a second order derivative of the count of remaining data points after a subsequent removal becomes negative, wherein the data points representing the candidates for peaks are extracted as remaining data points after a final removal;
   classifying the extracted data points based on a distance between adjacent data points in order to discriminate a cluster of distant data points from data points closely positioned to one or more dominant peaks, each distant data point in the cluster of distant data points defining a region in the waveform data associated to a characteristic of the electronic device;
   determining the one or more dominant peaks based on the cluster of distant data points such that the data points closely positioned to the determined one or more dominant peaks are ignored, wherein each dominant peak corresponds to the characteristic of the electronic device; and
   outputting the one or more dominant peaks as an analysis result for the electronic device.

2. The method of claim 1, wherein removing the data points, from the plurality of data points in the waveform data, corresponding to the background noise fluctuation comprises:
   calculating the smooth curve of the waveform data such that a fit to remaining data points is obtained after a previous removal; and
   selecting data points to be removed from the remaining data points based on an amplitude of each remaining data point relative to the smooth curve.

3. The method of claim 2, wherein removing data points, from the plurality of data points in the waveform data, corresponding to the background noise fluctuation comprises:
   repeatedly removing the data points with each optimal parameter until a number of iterations reaches a specified number of times, the data points representing the candidates for peak being extracted as remaining data points after the final removal.

4. The method of claim 1, wherein the distance between adjacent data points corresponds to an interval between the adjacent data points in the extracted data points with respect to an independent variable of the waveform data.

5. The method of claim 1, wherein classifying the extracted data points based on the distance between adjacent data points comprises:
   performing a clustering analysis on a plurality of random seeds; and
   selecting a combination of clusters based on a separation between the cluster of the distant data points and another cluster comprising the data points closely positioned to the one or more dominant peaks and a number of members in the another cluster for each random seed if a plurality of different combinations is obtained by the clustering analysis, the separation being defined as a separation between a minimum value of the distance in the cluster and a maximum value of the distance in the another cluster.

6. The method of claim 1, wherein classifying the extracted data points based on the distance between adjacent data points comprises:
   dividing the extracted data points into a first cluster having a larger distance and a second cluster having a shorter distance;
   determining whether a further division is required; and
   in response to determining that the further division is required, dividing data points of the second cluster into a third cluster having a larger distance and a fourth cluster having a shorter distance; and
   merging the first cluster and the third cluster as the cluster of the distant data points.

7. The method of claim 1, wherein determining the one or more dominant peaks comprises:
   setting boundaries between adjacent distant data points in the cluster of distant data points to define the region in the waveform data associated to the characteristic of the electronic device; and
   detecting an extreme from the waveform data within each region defined by adjacent boundaries.

8. The method of claim 1, wherein the smooth curve is based on a locally weighted scatterplot smoothing technique and classifying the extracted data points is based on a k-means clustering analysis.

9. The method of claim 1, wherein each data point comprises an independent variable and a dependent variable, the independent variable being either frequency or time, the dependent variable being a magnitude of an electromagnetic interference signal emitted from the electronic device with respect to the independent variable, the electronic device including a plurality of noise sources with different base frequencies.

\* \* \* \* \*